United States Patent
Gaff et al.

(10) Patent No.: US 10,690,414 B2
(45) Date of Patent: Jun. 23, 2020

(54) MULTI-PLANE HEATER FOR SEMICONDUCTOR SUBSTRATE SUPPORT

(71) Applicant: Lam Research Corporation, Fremont, CA (US)

(72) Inventors: Keith William Gaff, Fremont, CA (US); Benny Wu, Fremont, CA (US); Eric A. Pape, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 697 days.

(21) Appl. No.: 14/966,198

(22) Filed: Dec. 11, 2015

(65) Prior Publication Data

US 2017/0167790 A1 Jun. 15, 2017

(51) Int. Cl.

| F27B 17/00 | (2006.01) |
|---|---|
| H01L 21/683 | (2006.01) |
| H01L 21/67 | (2006.01) |
| H05B 3/00 | (2006.01) |
| H05B 3/26 | (2006.01) |
| F27D 11/02 | (2006.01) |

(52) U.S. Cl.
CPC .......... F27B 17/0025 (2013.01); F27D 11/02 (2013.01); H01L 21/67103 (2013.01); H01L 21/6831 (2013.01); H05B 3/0014 (2013.01); H05B 3/26 (2013.01)

(58) Field of Classification Search
CPC ............... F27D 11/02; H01L 21/67103; H01L 21/6831; H01L 21/67098; F27B 17/0025; H05B 3/0014; H05B 3/26; H05B 1/0233; H05B 2203/005

USPC ...... 118/725, 728; 219/444.1, 390, 480, 209
See application file for complete search history.

(56) References Cited

U.S. PATENT DOCUMENTS

| 3,752,956 | A | * | 8/1973 | Cahill ................ G05D 23/2401 219/497 |
|---|---|---|---|---|
| 5,994,675 | A | * | 11/1999 | Bethune ............ H01L 21/67103 118/724 |
| 6,133,557 | A |  | 10/2000 | Kawanabe et al. |
| 6,796,795 | B2 | * | 9/2004 | Inaba .................... C23C 14/564 118/725 |
| 6,847,014 | B1 |  | 1/2005 | Benjamin et al. |
| 6,921,724 | B2 |  | 7/2005 | Kamp et al. |
| 7,075,031 | B2 | * | 7/2006 | Strang ............... H01J 37/32724 118/723 I |

(Continued)

FOREIGN PATENT DOCUMENTS

JP 2004241302 * 8/2004

*Primary Examiner* — Ibrahime A Abraham
*Assistant Examiner* — Frederick F Calvetti

(57) ABSTRACT

A semiconductor substrate support for supporting a semiconductor substrate in a plasma processing chamber includes a multi-plane heater such as a heater array comprising thermal control elements operable to tune a spatial temperature profile on the semiconductor substrate. The multi-plane heater includes at least one pair of vertically offset heating elements connected in series or parallel to control heating output in a heating zone on the substrate support. The thermal control elements can be powered by two or more power supply lines and two or more power return lines wherein each power supply line is connected to at least two of the heater zones and each power return line is connected to at least two of the heater zones.

41 Claims, 13 Drawing Sheets

(56) References Cited

U.S. PATENT DOCUMENTS

| | | | |
|---|---|---|---|
| 7,196,295 B2* | 3/2007 | Fennewald | B29C 45/2737 |
| | | | 219/212 |
| 7,268,322 B2* | 9/2007 | Kuibira | H01L 21/67109 |
| | | | 118/724 |
| 8,546,732 B2* | 10/2013 | Singh | H01L 21/67109 |
| | | | 219/486 |
| 8,624,168 B2* | 1/2014 | Gaff | H01L 21/67109 |
| | | | 219/444.1 |
| 8,637,794 B2* | 1/2014 | Singh | C23C 14/541 |
| | | | 219/483 |
| 8,680,441 B2* | 3/2014 | Singh | H01L 21/67109 |
| | | | 219/486 |
| 8,791,392 B2* | 7/2014 | Singh | H01L 21/67109 |
| | | | 219/446.1 |
| 8,884,194 B2* | 11/2014 | Singh | C23C 14/541 |
| | | | 219/444.1 |
| 8,901,459 B2* | 12/2014 | Lee | H01L 21/67103 |
| | | | 219/385 |
| 8,952,297 B2* | 2/2015 | He | H01L 21/67115 |
| | | | 118/728 |
| 9,019,684 B2 | 4/2015 | Kuribayashi | |
| 9,123,755 B2* | 9/2015 | Swanson | H01L 21/67103 |
| 9,263,305 B2* | 2/2016 | Ptasienski | H05B 3/20 |
| 9,812,342 B2* | 11/2017 | Swanson | H01L 21/67103 |
| 10,049,948 B2* | 8/2018 | Gaff | H01L 21/67248 |
| 10,340,162 B2* | 7/2019 | Swanson | H01L 21/67248 |
| 2001/0019741 A1* | 9/2001 | Inaba | C23C 14/564 |
| | | | 427/444 |
| 2005/0145617 A1 | 7/2005 | McMillin et al. | |
| 2006/0096972 A1 | 5/2006 | Nakamura | |
| 2007/0000918 A1* | 1/2007 | Steinhauser | A47J 37/0676 |
| | | | 219/685 |
| 2007/0215602 A1 | 9/2007 | Natsuhara et al. | |
| 2007/0278213 A2 | 12/2007 | McMillin et al. | |
| 2008/0110874 A1 | 5/2008 | Hayashi et al. | |
| 2009/0159590 A1 | 6/2009 | Yonekura et al. | |
| 2009/0183677 A1* | 7/2009 | Tian | H01L 21/67098 |
| | | | 118/667 |
| 2009/0215201 A1* | 8/2009 | Benjamin | H01L 21/67069 |
| | | | 438/5 |
| 2009/0314762 A1 | 12/2009 | Cui et al. | |
| 2010/0043708 A1 | 2/2010 | Choi et al. | |
| 2010/0116788 A1* | 5/2010 | Singh | C23C 16/4586 |
| | | | 216/66 |
| 2010/0163546 A1* | 7/2010 | Nanno | H05B 3/74 |
| | | | 219/494 |
| 2011/0092072 A1* | 4/2011 | Singh | C23C 14/541 |
| | | | 438/710 |
| 2011/0143462 A1 | 6/2011 | Gaff et al. | |
| 2012/0091108 A1* | 4/2012 | Lin | H01L 21/67109 |
| | | | 219/201 |
| 2013/0001213 A1* | 1/2013 | Lee | H01L 21/67103 |
| | | | 219/385 |
| 2013/0098895 A1* | 4/2013 | Swanson | H05B 3/20 |
| | | | 219/508 |
| 2013/0105457 A1* | 5/2013 | Swanson | H05B 3/20 |
| | | | 219/209 |
| 2013/0105462 A1 | 5/2013 | Schmidt et al. | |
| 2013/0161305 A1* | 6/2013 | Ptasienski | H05B 3/20 |
| | | | 219/201 |
| 2013/0220989 A1 | 8/2013 | Pease et al. | |
| 2013/0228548 A1 | 9/2013 | Ptasienski et al. | |
| 2013/0270250 A1 | 10/2013 | Pease et al. | |
| 2013/0321974 A1 | 12/2013 | Kuribayashi | |
| 2014/0007416 A1 | 1/2014 | Lindley et al. | |
| 2014/0096909 A1* | 4/2014 | Singh | C23C 14/541 |
| | | | 156/345.52 |
| 2014/0154819 A1 | 6/2014 | Gaff et al. | |
| 2014/0263274 A1* | 9/2014 | Singh | H01L 21/67109 |
| | | | 219/444.1 |
| 2015/0055940 A1 | 2/2015 | Steinhauser | |
| 2015/0228513 A1* | 8/2015 | Parkhe | H01L 21/67103 |
| | | | 219/444.1 |
| 2016/0372352 A1* | 12/2016 | Wu | H01L 21/67248 |
| 2017/0048529 A1 | 2/2017 | Kim et al. | |
| 2018/0061682 A1* | 3/2018 | Swanson | H01L 21/67103 |

* cited by examiner

MULTI-PLANE HEATER FOR SEMICONDUCTOR SUBSTRATE SUPPORT

FIELD

The present disclosure relates to plasma processing chambers, such as, a plasma etching chamber having a substrate support assembly with an array of thermal control elements achieving a spatial temperature profile on a semiconductor substrate distribution during plasma processing.

BACKGROUND

Critical dimension (CD) control is a challenge during semiconductor substrate manufacturing steps such as plasma etching. The uniformity of CD across the substrate can also affect the yield of chips from the substrate. In known semiconductor manufacturing nodes, a CD uniformity of <1 nm can be specified.

Controlling temperature is not an easy task for several reasons. First, many factors can affect heat transfer, such as the locations of heat sources and heat sinks, and the movement, materials and shapes of the media. Second, heat transfer is a dynamic process. Unless the system in question is in heat equilibrium, heat transfer can occur and the temperature profile and heat transfer will change with time. Third, non-equilibrium phenomena, such as plasma, which of course is always present in plasma processing, make the theoretical prediction of heat transfer behavior of any practical plasma processing apparatus very difficult if not impossible.

The substrate temperature profile in a plasma processing apparatus is affected by many factors, such as the plasma density profile, the radio frequency (RF) power profile and the detailed structure of the various heating and cooling elements in the electrostatic chuck assembly, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

SUMMARY

According to one embodiment, a multi-plane heater of a semiconductor substrate support for supporting a semiconductor substrate in a plasma processing chamber comprises a body of dielectric material containing a first resistance heating element vertically offset from a second resistance heating element electrically connected in series to the first heating element such that the first and second resistance heating elements form an individually addressable thermal control element.

According to another embodiment, a semiconductor substrate support comprises an electrostatic clamping layer including at least one electrostatic clamping electrode configured to electrostatically clamp a semiconductor substrate on a support surface of the substrate support, a multi-plane heater comprising a body of dielectric material containing a first resistance heating element vertically offset from a second resistance heating element electrically connected in series to the first heating element such that the first and second resistance heating elements form an individually addressable thermal control element, and a temperature controlled base plate beneath the multi-plane heater.

According to a further embodiment, a multi-plane heater of a semiconductor substrate support for supporting a semiconductor substrate in a plasma processing chamber comprises a heater array of independently controlled heating elements operable to tune a spatial temperature profile on the semiconductor substrate, the heater array including a first layer of independently controlled heating elements and a second layer of independently controlled heating elements, the first layer of heating elements including a first group of heating elements vertically offset from a second group of heating elements of the second layer of heating elements, the heating elements of the first group of heating elements electrically connected to the heating elements of the second group of heating elements such that each pair of vertically offset heating elements is an individually addressable thermal control element.

According to another embodiment, a semiconductor substrate support for supporting a semiconductor substrate in a plasma processing chamber includes an electrostatic clamping layer including at least one electrostatic clamping electrode configured to electrostatically clamp a semiconductor substrate on a support surface of the substrate support, a multi-plane heater comprising a heater array comprising independently controlled heating elements operable to tune a spatial temperature profile on the semiconductor substrate, the heater array including a first layer of independently controlled heating elements and a second layer of independently controlled heating elements, the first layer of heating elements including a first group of heating elements vertically offset from a second group of heating elements of the second layer of heating elements, the heating elements of the first group of heating elements electrically connected to the heating elements of the second group of heating elements such that each pair of vertically offset heating elements is an individually addressable thermal control element, and a temperature controlled base plate beneath the multi-plane heater.

According to another embodiment, a semiconductor substrate is plasma etched in a plasma processing chamber having a substrate support for supporting the substrate during plasma processing, the substrate support includes an electrostatic clamping layer including at least one electrostatic clamping electrode configured to electrostatically clamp the semiconductor substrate on a support surface of the substrate support, a multi-plane heater comprising a heater array comprising independently controlled heating elements operable to tune a spatial temperature profile on the semiconductor substrate, the heater array including a first layer of independently controlled heating elements and a second layer of independently controlled heating elements, the first layer of heating elements including a first group of heating elements vertically offset from a second group of heating elements of the second layer of heating elements, the heating elements of the first group of heating elements electrically connected to the heating elements of the second group of heating elements such that each pair of vertically offset heating elements is an individually addressable thermal control element, and a temperature controlled base plate beneath the multi-plane heater. The method comprises supporting a semiconductor substrate on the substrate support while controlling a temperature profile of the semiconductor substrate with the heating elements, supplying process gas into the plasma processing chamber and igniting the process gas to form a plasma, and plasma etching the semiconductor substrate with the plasma.

BRIEF DESCRIPTION OF THE DRAWINGS

In the following, the disclosure will be described in greater detail by means of exemplary embodiments and with reference to the attached drawings.

DETAILED DESCRIPTION

Considering the complex nature of temperature control on the surface of a substrate support assembly in a plasma processing chamber, it would be advantageous to incorporate multiple independently controllable planar thermal control elements in the substrate support assembly to enable the apparatus to actively create and maintain the desired spatial and temporal temperature profile, and to compensate for other adverse factors that affect CD uniformity, e.g., non-uniformity caused by upstream or downstream processes.

Figure 1:
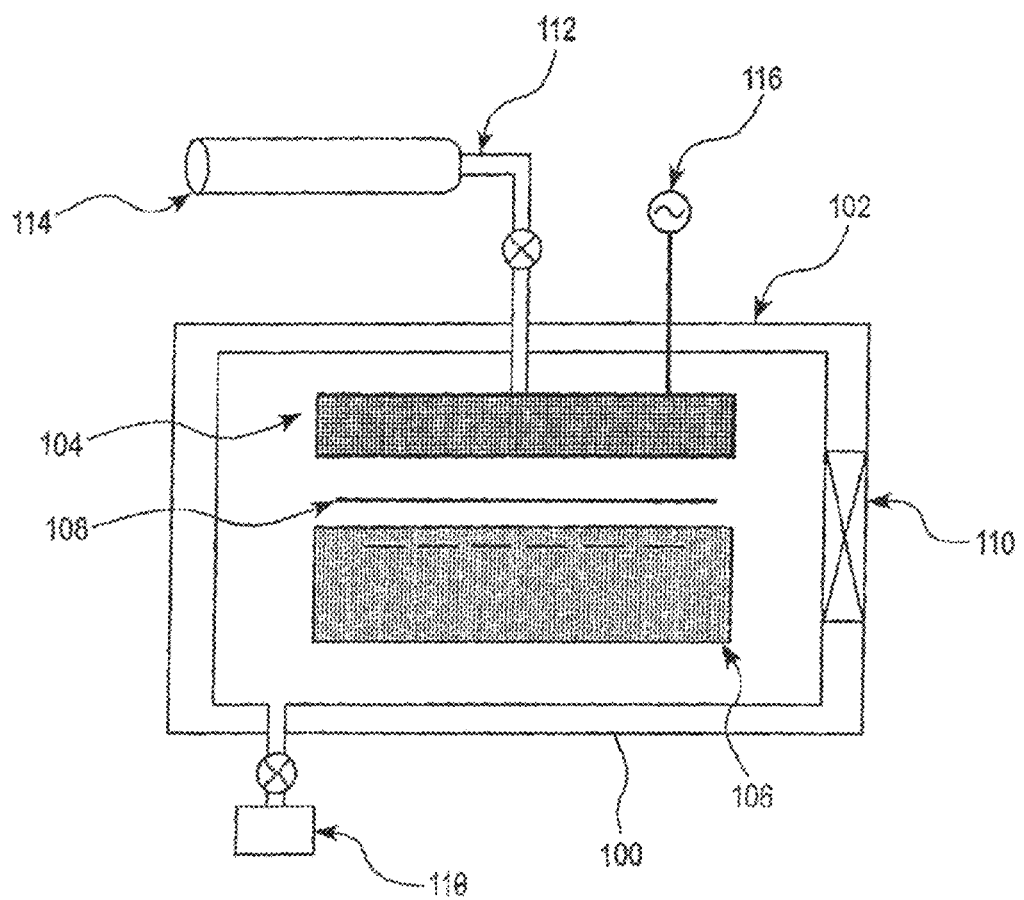
FIG. 1 illustrates a schematic overview of a plasma processing system in accordance with an exemplary embodiment.

FIG. 1 illustrates a schematic overview of a plasma processing apparatus 100 which includes a chamber 102 having an upper showerhead electrode 104 and a substrate support assembly 106 which includes a lower electrode. A substrate 108 such as a wafer can be loaded through a loading port 110 onto the substrate support assembly 106. A gas line 112 supplies process gas to the upper showerhead electrode 104 and the showerhead electrode delivers process gas into the chamber 102. A gas source 114 (e.g., a mass flow controller power supplying a suitable gas mixture) is connected to the gas line 112. A radio frequency (RF) power source 116 is connected to the upper showerhead electrode 104. A vacuum pump 118 can be used to evacuate the chamber 102, so that the RF power is capacitively coupled between the upper showerhead electrode 104 and the lower electrode (not shown) in the substrate support assembly 106 to energize the process gas into plasma in the space between the substrate 108 and the upper showerhead electrode 104. The plasma can be used to etch device die features into layers on the substrate 108.

It should be appreciated that while the detailed design of the plasma processing apparatus 100 may vary, in exemplary embodiments RF power is coupled through the substrate support assembly 106. While a capacitively coupled plasma chamber is shown, the plasma processing apparatus can rely on other mechanisms to generate plasma, such as inductive coupling (transformer coupling), helicon, electron cyclotron resonance, or the like. For instance, high density plasma can be produced in a transformer coupled plasma (TCP™) processing chamber, or in an electron cyclotron resonance (ECR) processing chamber. For example, in a transformer coupled plasma processing chamber, RF energy is inductively coupled through a dielectric window into the chamber. In addition, a plasma processing apparatus 100 can be configured with a high-density plasma source, such as an inductively coupled plasma (ICP) source, in conjunction with a radio frequency (RF) biased substrate electrode. A plasma processing apparatus in the context of exemplary embodiments of the present disclosure is not limited to the above-described examples, and can be any of a number of suitable implementations as desired.

Figure 2A:
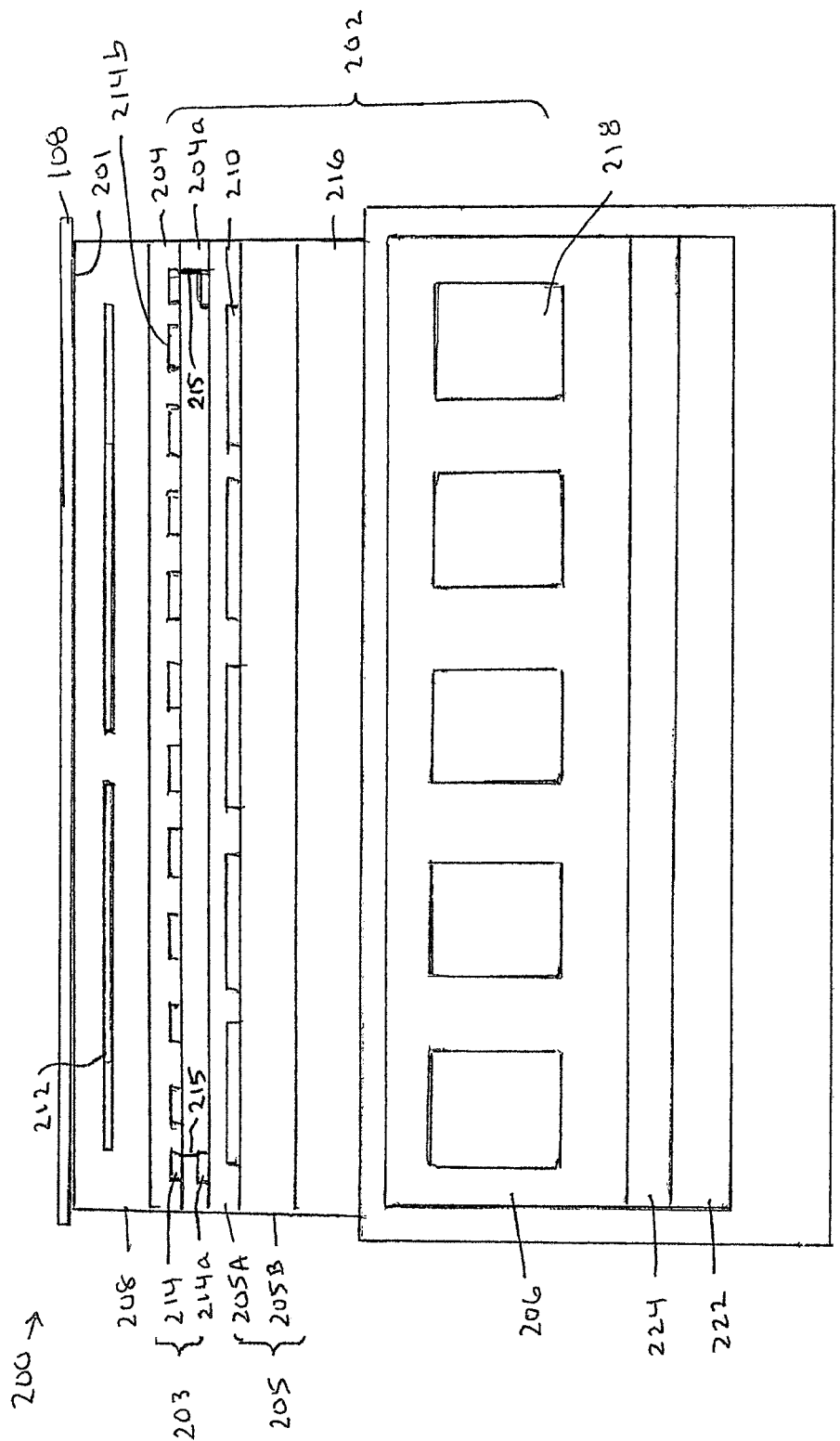
FIG. 2A illustrates a schematic diagram of a first arrangement of an electrostatic chuck (ESC) assembly including a multi-plane heater and control electronics in accordance with an exemplary embodiment including a multi-plane heater.

FIG. 2A illustrates a schematic overview of a first arrangement of a substrate support assembly 200 including a multi-plane heater 203 and control electronics in accordance with an exemplary embodiment of the present disclosure.

The substrate support assembly 200 can be configured for a variety of functions during plasma processing, such as supporting the substrate, tuning the substrate temperature, and supplying radio frequency power. To achieve these functions, the substrate support assembly can include an electrostatic chuck (ESC) assembly 202. The ESC assembly 202 can include a dielectric layer 208 such as a dielectric polymeric or ceramic material, a primary heating layer 205 including one or more primary heaters, a multi-plane heater 203 having two or more vertically offset heating elements, and a baseplate 206 such as a temperature controlled radiofrequency (RF) driven metal plate having passages 218 for flow of temperature controlled fluid. The dielectric layer 208 includes one or more clamping electrodes 212 (e.g., monopolar or bipolar) for electrostatically clamping a substrate 108 onto the substrate support assembly 200 during processing. The dielectric layer 208 is located above the primary heating layer 205. In an exemplary embodiment, the dielectric layer 208 can be bonded to the multi-plane heater 203, which is bonded to the primary heating layer 205. Alternatively, the multi-plane heater 203 and primary heater layer 205 can be integrated in a monolithic body such as a sintered ceramic body. When DC voltage is applied to the clamping electrode(s) 212, an electrostatic clamping force is established and clamps the substrate 108 to the substrate support surface 201 of the dielectric layer 208.

The primary heating layer 205 can include one or more primary heaters 210 incorporated in a laminate of two electrically insulating layers 205A and 205B or be optionally attached to a metal or ceramic plate (not shown). The electrically insulating layers 205A, 205B can be formed of a polymer material, an inorganic material, a ceramic such as silicon oxide, alumina, yttria, aluminum nitride or any other suitable insulating material as desired. When connected to AC or DC power, the one or more primary heaters 210 generate a substantial portion of heat to achieve a desired surface temperature profile of the substrate support surface 201. The primary heating layer 205 can be above or below the multi-plane heater 203 but preferably is below the multi-plane heater 203. In an embodiment, the primary heating layer 205 can include one or more heating zones in which two or more vertically offset primary heaters are connected together in series or in parallel to form an individually addressable thermal control element.

The multi-plane heater 203 can include one or more heating zones comprised of two or more vertically offset heating elements connected in series or parallel to form individually addressable thermal control elements. In the embodiment shown in FIG. 2A, the multi-plane heater includes upper heating elements 214 on dielectric layer 204 and vertically offset heating elements 214a on dielectric layer 204a. In a preferred embodiment, the multi-plane heater 203 includes a first group of heating elements 214 extending around an outer periphery of the dielectric layer 204 and a second group of heating elements extending around an outer periphery of dielectric layer 204a. However, the vertically offset heating elements can be located at any desired location on the ESC assembly 202.

The multi-plane heater 203 can include a single layer of heating elements such as a third group of heating elements 214b on the same plane as the heating elements 214. For example, the third group of heating elements 214b can be laterally distributed across an area located inwardly of the first group of heating elements 214. The third group of heating elements 214b can have the same size or larger size than the heating elements 214 in the first group of heating elements. Preferably, each heating element 214 of the first group of heating elements is electrically connected to a single heating element 214a of the second group of heating elements. In an embodiment, each heating element 214 in the first group is connected in series to a single heating element 214a in the second group such that each pair of vertically offset heating elements 214, 214a forms an individually addressable thermal control element. Alternatively, each vertically offset pair of heating elements can be connected in parallel. In either case, powering one heating element 214, 214a of the thermal control element powers the other heating element of the vertically offset pair of heating elements to generate heat in a localized zone on the support surface 201 above the thermal control element. Thus, each pair of heating elements 214/214a is powered together as a thermal control element and each of the thermal control elements can be powered individually or powered in groups of heating elements as thermal control elements.

Figure 2B:
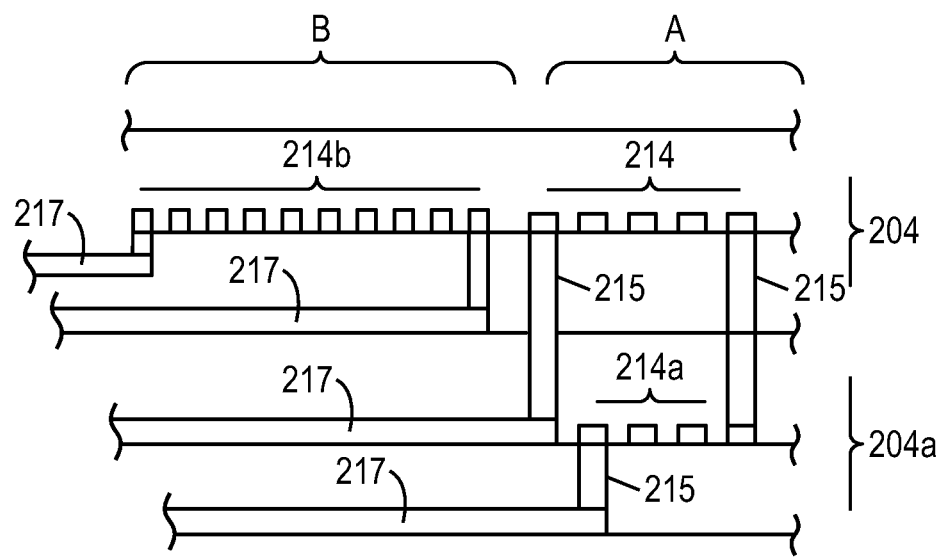
FIG. 2B illustrates a series connection between vertically offset heating elements and FIG. 2C illustrates a parallel connection between vertically offset heating elements.

FIG. 2B illustrates an exemplary series connection between vertically offset heating elements 214, 214a. As explained in more detail later, the heating elements 214, 214a, 214b can take various forms such as foil heaters, thin film heaters, electrically resistive traces, or the like. The heating elements can be arranged on layers of dielectric material which are bonded together or the multi-plane heater can be built up on ceramic green sheets or built up from deposited layers. Upon sintering of the ceramic material, the heating elements, power connections and other features of the substrate support can be incorporated in a monolithic ceramic body such as alumina or other suitable material.

To illustrate the series electrical connection for a multi-plane heater in the form of discrete layers which are bonded together, FIG. 2B shows a portion of a multi-plane heater wherein heating elements 214, 214b are incorporated in dielectric layer 204 and vertically offset heating elements 214a are incorporated in dielectric layer 204a with three vias 215 connecting heating elements 214, 214a in series, i.e., one end of heating element 214a is connected to a first via 215 extending from a power line 217, the other end of heating element 214a is connected to one end of heating element 214 by a second via 215, and the other end of heating element 214 is connected to a third via 215 extending from a power line 217. Power lines 217 (supply and return lines) can be arranged on any of the dielectric layers to individually supply power to heating elements 214, 214a below heating zone A and heating element 214b below heating zone B. Each heating zone on the substrate support surface can be defined by one or more of the heating elements. By connecting the vertically offset heating elements 214, 214a in series, it is possible to form an individually addressable thermal control element which provides a desired heat density. If a particular location on the substrate surface requires a higher heat density than achievable with two vertically offset heating elements connected in series, one or more additional vertically offset heaters can be connected in series to the two vertically offset heating elements.

Figure 2C:
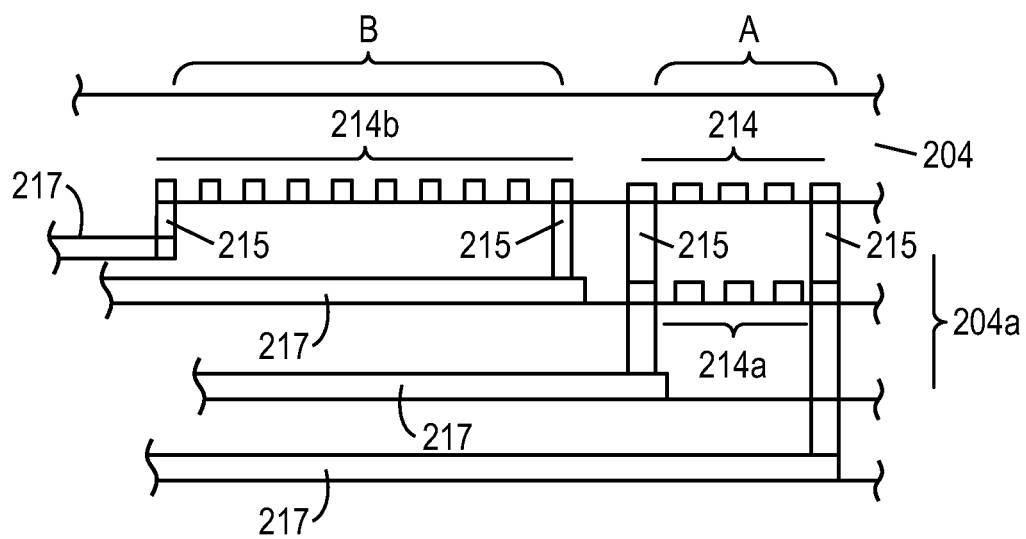

To illustrate a parallel electrical connection for a multi-plane heater in the form of discrete layers which are bonded together, FIG. 2C shows a portion of a multi-plane heater wherein heating elements 214, 214b are incorporated in dielectric layer 204 and vertically offset heating elements 214a are incorporated in dielectric layer 204a with two vias 215 connecting heating elements 214, 214a in parallel, i.e., one end of each heating element 214, 214a is connected to a first via extending from a power line 217 and the other end of each heating element 214, 214a is connected to a second via 215 extending from a power line 217. Power lines 217 (supply and return lines) can be arranged on any of the dielectric layers to individually supply power to heating elements 214, 214a below heating zone A and heating element 214b below heating zone B. Each heating zone on the substrate support surface can be defined by one or more of the heating elements. By connecting the vertically offset heating elements 214, 214a in parallel, it is possible to form an individually addressable thermal element which provides a desired heat density. If a particular location on the substrate surface requires a higher heat density than achievable with two vertically offset heating elements, one or more additional vertically offset heaters can be connected in parallel to the two vertically offset heating elements.

Fine tuning of the surface temperature profile established by the primary heating layer 205 can be provided by the thermal control elements 214/214a, 214b which through suitable selection and timing can reduce temperature gradients across the substrate support surface 201. The thermal control elements 214/214a, 214b can include an array of heater elements operable to tune a spatial temperature profile on the semiconductor substrate support surface. In an exemplary embodiment, the heating elements are arranged in vertically offset first and second groups and preferably comprise resistance heaters such as film heaters, diodes, or other heat generating element arranged in any suitable geometric array or pattern. It should be understood that in exemplary embodiments, the heater array can include a single type of local temperature element or any combination of local temperature element types as desired. For example, the heater array can include a mixture of larger and smaller heating elements arranged with some of the heating elements vertically offset from other heating elements to achieve the desired spatial temperature profile.

In a preferred embodiment, the multi-plane heater 203 is located between the dielectric layer 208 and the primary heating layer 205. In this arrangement, the primary heating layer 205 can be in contact with a surface of a thermal barrier layer 216, which is disposed on the baseplate 206.

The baseplate 206 has a plurality of channels 218 for flow of a thermal transfer medium such as a coolant or heated fluid. The baseplate 206 can be attached to the chamber via a ceramic insulator ring (not shown). Attachment of the baseplate 206 to the ceramic insulator ring can be realized through screws, or any other suitable attaching means as desired.

With the multi-plane heater, at least some heating elements can overlap and be powered to different levels to provide the desired power density for a specific control voltage and available resistive materials. For example, one might have a spot size of 1 cm area and wish to achieve high power output of 100 W. For a control voltage of 10V, this means a resistance of 1 ohm ($I^2R$). But with this small spot, a single heater layer means that resistance cannot be, say, lower than 2 Ohms. Thus, to achieve desired resistance identical heating elements can be vertically offset on two parallel layers to create the overall required resistance. In another example, it may be desirable to have multiple heaters of different sizes on the same heater layer, but the same resistance is required for all heaters for system power control or variable spatial power density requirements. For example, there could be one annular ring of heating elements that are half the size of all other elements and cannot increase resistance because of manufacturing limits on materials and heater trace design. This means that it is necessary to quadruple the power output in those elements compared to other heating elements. However, with two layers of heater elements on this annular ring in series connections between each pair of vertically offset heating elements, it is possible to increase resistances enough to only double the spatial power density and to also not drive too much current through the power distribution system when running these heaters.

In one multi-plane heater design, the ESC assembly can have multiple layer heaters in some zones and not others such as a single layer of larger heaters in a central region of the wafer and smaller stacked heaters in a peripheral region of the substrate support. In this case, there would be two vertically aligned heaters of the same size extending completely around the peripheral region. However, if the lower plane of heating elements has slight additional thermal spreading, the lower heating elements may be slightly smaller to match heat output at some arbitrary plane far above the heaters. The vertically aligned heaters are preferably turned on and off together so that a zone above the heaters could see more heat than zones where there is a single layer of heaters. Thus, whether the vertically aligned heaters are connected together serially or in parallel, they would be operated together and depending on the connection method, this could mean either reduced or increased heating as compared to equivalent sized heaters that only had a single layer. Although the vertically aligned heaters are preferably located at an outer periphery of the ESC assembly, the vertically offset heating elements could be in other locations where controlled heating is desired. Each pair of vertically offset heating element acts as a unit and can be powered via two contact electrodes. This has a huge impact on thermal control of an ESC assembly which has many holes for backside cooling, lift pins, sensors, and other internal components. The heating elements can be powered with any suitable powering arrangement such as a non-DC power component (e.g. pulse width control DC or AC) to mitigate magnetic fields. By utilizing heating elements of various sizes in the multi-plane heater, it is possible to design an ESC assembly which compensates for through holes, cavities and internal components with desired power densities met by using both smaller and larger heating elements that could otherwise not be manufactured with present technology relative to the resistance of the heaters. This serial/parallel connection approach is quite powerful in this regard.

The multi-plane heater thus provides an ESC assembly which includes many thermal control elements, each of which is an individually addressable resistive heater having power and return contacts. A desired temperature in a heater zone on the substrate support surface can be controlled by controlling heating of each thermal control element. The heating elements can be arranged in groups to create multiple heater zones on the ESC support surface. Each heating element provides a heater zone, or thermal control element and multiple heating elements can be combined to create one heater zone or thermal control element.

The multi-plane heater can be powered by any suitable power scheme. For example, commonly-assigned U.S. Published Application 2013/0220989 discloses a multiplexed heater array using AC drive, commonly-assigned U.S. Published Application 2013/0270250 discloses a current peak spreading scheme for multiplexed heater array, commonly-assigned U.S. Published Application 2014/0048529 discloses a system for monitoring temperatures and controlling a multiplexed heater array, and commonly-assigned U.S. Published Application 2014/0154819 discloses a power switching system for ESC with an array of thermal control elements, the disclosures of each of which is hereby incorporated herein.

The baseplate 206 is preferably disposed on a facilities plate which provides coolant fluid, gas, and electrical power to the electrostatic chuck assembly. Details of suitable facilities plate can be found in commonly-assigned U.S. Patent Publication 2014/0154819, the disclosure of which is hereby incorporated by reference. The baseplate 206 can be attached (e.g., electrically connected) to the facilities plate via screws or other suitable attaching means as desired. In the exemplary embodiments described herein, the baseplate of the electrostatic chuck assembly and facilities plate are made of electrically conducting material, such as metal, or coated with an electrically conducting material. An RF gasket (not shown), which is electrically conductive, can be disposed between an outer edge of the baseplate 206 and the facilities plate to establish an electrical connection therebetween. The facilities plate is connected to an RF power source $V_{RF}$ and provides RF power to the baseplate 206. In another exemplary embodiment, the facilities plate can include insulated and/or shielded connections and conduits that provide RF power and/or other specified facilities (e.g., helium, coolant, or other suitable supply as desired) to the ESC assembly 202. All DC and AC power for the electrostatic chuck assembly can be fed through the facilities plate via a single cable (not shown). Any combination and number of RF filters, as desired, can be disposed between AC or DC power supplies that are located outside the plasma processing chamber and the facilities plate. In an exemplary embodiment in which an AC power supply is connected to feed electrical power to the facilities plate, one or more AC-to-DC converters can be used to convert the power signal from the AC power supply to a DC power signal prior to the signal being fed to the facilities plate.

A power distribution circuit can be formed on a first circuit board, e.g., a distribution board, configured to be mated to the baseplate 206 of the support assembly 200 in an enclosed volume between the baseplate 206 and the facilities plate (for details see commonly-assigned USPA 2014/0154819). The distribution board can be attached to a bottom surface of the baseplate 206 via bonding, such as a layer of adhesive, or by mechanical means such as screws (not shown) or other suitable bonding means as desired. The baseplate 206 and facilities plate act as an RF shield (e.g., electrostatic shield) when they are made of electrically conducting material or coated with an electrically conducting material so that the RF current travels along outer surfaces of the facilities plate and the baseplate 206 and around the enclosed volume rather than through the distribution board and control electronics. In this arrangement, the distribution board is shielded from RF noise (e.g., interference). In the context of exemplary embodiments of the present disclosure, RF noise can be any unwanted or spurious RF signal whether it has a random power spectrum or unwanted coupling of specific frequencies generated by the RF sources in the system such as the bias generators connected to the electrostatic chuck assembly 202. The RF shield can be a closed conductor shield (e.g., baseplate 206 and facilities plat) containing a finite number of connector penetrations, each connector penetration being decoupled from RF common using bypass capacitors. The bypass connectors are located between the electrical connections and the RF shield and are outside the enclosed volume.

The distribution board can include multiple layers where one layer is a common voltage plane (e.g., common conductive plane) for the electronics connected to the facilities plate so that the voltage on the common plane is at the same electrical potential as the facilities plate and the baseplate 206 so as to reduce the likelihood of arcing from the facilities plate or baseplate 206 to the components or circuits on the distribution board when RF power is supplied to the baseplate 206. The distribution board can include at least two terminals to connect input power lines of the power distribution circuit to an AC or DC power supply. The distribution board can also include at least $2\sqrt{N}$ output power lines to connect the input power lines of the power distribution circuit to the thermal control elements 214/214a, 214b of the thermal array in the electrostatic chuck assembly 202, where N equals a number of thermal control elements 214, 214b. The distribution board can also include traces that route electrical current from the pads to wires passing through the baseplate 206. The distribution board can include filtering elements, such as capacitors connected between one or more of the input power lines and the facilities plate, from the output power lines to the facilities plate, and/or between the common voltage plane and the baseplate 206 and/or facilities plate, to shunt RF current flowing through the facilities plate thus prevent RF current flowing through the components of the distribution board. In an exemplary embodiment, the distribution board can include memory for storing calibration data or identification numbers for the ESC assembly 202.

In another exemplary embodiment, the facilities plate can be formed from a non-conductive, dielectric and/or mesh material. In such case, the common voltage plane of the distribution board can form a shielded enclosure for the distribution board by being attached (e.g., electrically connected) to the baseplate 206. It should be understood that in this exemplary embodiment the common voltage plane is a metal plate or metal form such that when attached to the cooling plate 206 establishes a Faraday shield such that no active RF in the plasma processing chamber enters the enclosure.

Figure 3:
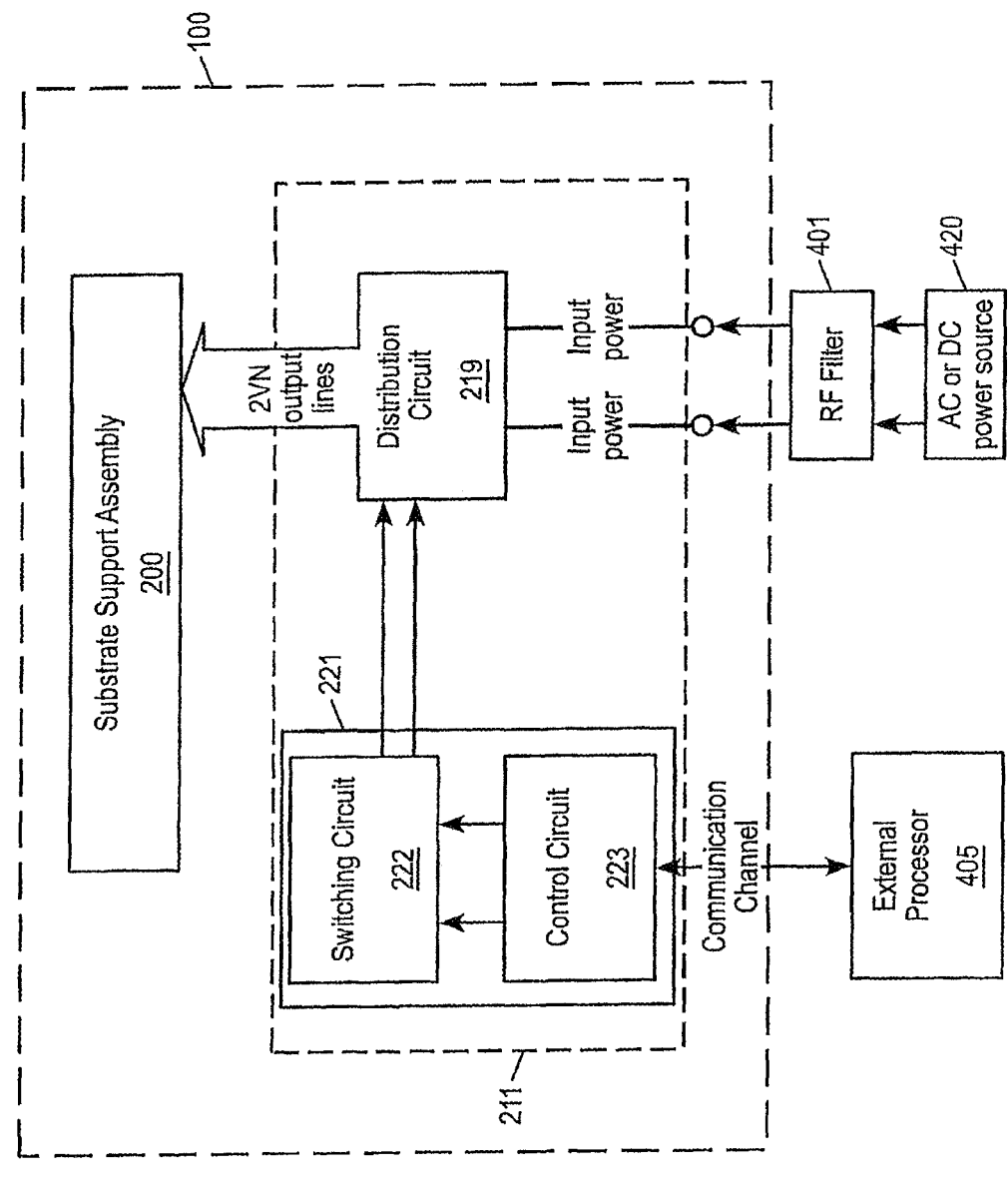
FIG. 3 illustrates a schematic diagram of an exemplary power distribution assembly for the ESC assembly.

As shown in FIG. 3, a power distribution assembly 211 also includes a power switching device 221. The power switching device 221 includes a switching circuit 222 and a control circuit 223. The switching circuit 222 of the switching device 221 is connected to a power distribution circuit 219 to independently supply power to each one of the thermal control elements 214/214a, 214b via one of the power supply lines 217 and one of the power return lines 217 to provide time-averaged power to each of the thermal control elements 214/214a, 214b by time divisional multiplexing of a plurality of switches by addressably connecting one or more thermal control elements of the thermal array of the substrate support assembly 200 to AC or DC power from a suitable AC/DC power source 420 connected thereto via an RF filter 401. The control circuit 223 communicates with an external device, such as a processor or computer 405 outside of the plasma processing chamber, for command and control of the power distribution and switching circuits. In an exemplary embodiment, the switching and control circuits 222, 223 can be formed on the distribution circuit board of the power distribution assembly 211. In another exemplary embodiment, the switching and control circuits 222, 223 can be formed on a second circuit board, e.g., a switching electronics board 226 (see FIG. 5), which can be mated to the distribution board of the power distribution circuit 219.

The switching electronics board 226 can be a printed circuit board (PCB) that includes circuitry for addressably supplying switched power to the array of thermal control elements 214/214a, 214b. The switching electronics board 226 can be disposed in an enclosed volume 234 between a facilities plate 224 and the baseplate 206 in a location between a distribution circuit board 228 and the facilities plate 224. The switching electronics board 226 includes a common voltage plane 227 for the electronics which is electrically connected to the facilities plate 224 so that the voltage on the common plane 227 is at the same electrical potential as the facilities plate 224 to reduce the likelihood of arcing between the facilities plate 224 and components or circuits on the switching electronics board 226. The switching electronics board 226 can also include capacitors connected between one or more of the input power lines and the facilities plate 224, from the output power lines to the facilities plate 224, and between the common voltage plane 227 and the facilities plate 224 to shunt RF current flowing through the facilities plate 224, thereby preventing RF current flowing through the switching and control circuits of the switching electronics board 226. In another exemplary embodiment, the switching electronics board 226 can be attached to an upper surface of the facilities plate 224. For example, the switching electronics board 226 can be mated to a lower surface of the distribution board 228 so that the switching electronics board 226 is within the enclosed volume 234 between the distribution board 228 and an upper surface of the facilities plate 224.

RF power received from an RF source $V_{RF}$ by the facilities plate 224 is provided to the ESC assembly 202 via an electrical connection to the baseplate 206. As already discussed, an RF gasket can be disposed between the facilities plate 224 and the baseplate 206, and provide an interface that establishes the electrical connection between the two components. It should be understood that the ESC assembly 202 may incorporate features of the tunable ESC (T-ESC). Assemblies described in commonly-assigned U.S. Pat. Nos. 6,847,014 and 6,921,724, which are hereby incorporated by reference.

The distribution board 228 can include pads that provide electrical contact with pins on the switching electronics board 226. The distribution board 228 can also include traces that route electrical current from the pads to wires passing through the baseplate 206. In another exemplary embodiment, sockets are located on each input line of the distribution board 228 and mate with the pins located on the switching electronics board 226. The distribution board 228 can include memory for storing calibration data or identification numbers for the ESC assembly 202. With this configuration, the switching electronics board 226 has read/write access to the memory of the distribution board 228.

In another exemplary embodiment, the switching electronics board 226 includes sockets on each output line that mate with pins on the distribution board 228, which is attached to the baseplate 206, so that an electrical connection can be established. In an exemplary embodiment, the switching electronics board 226 includes pads on each output line that contact pins on the distribution board 228 of the baseplate 206 to establish an electrical connection.

Figure 4:
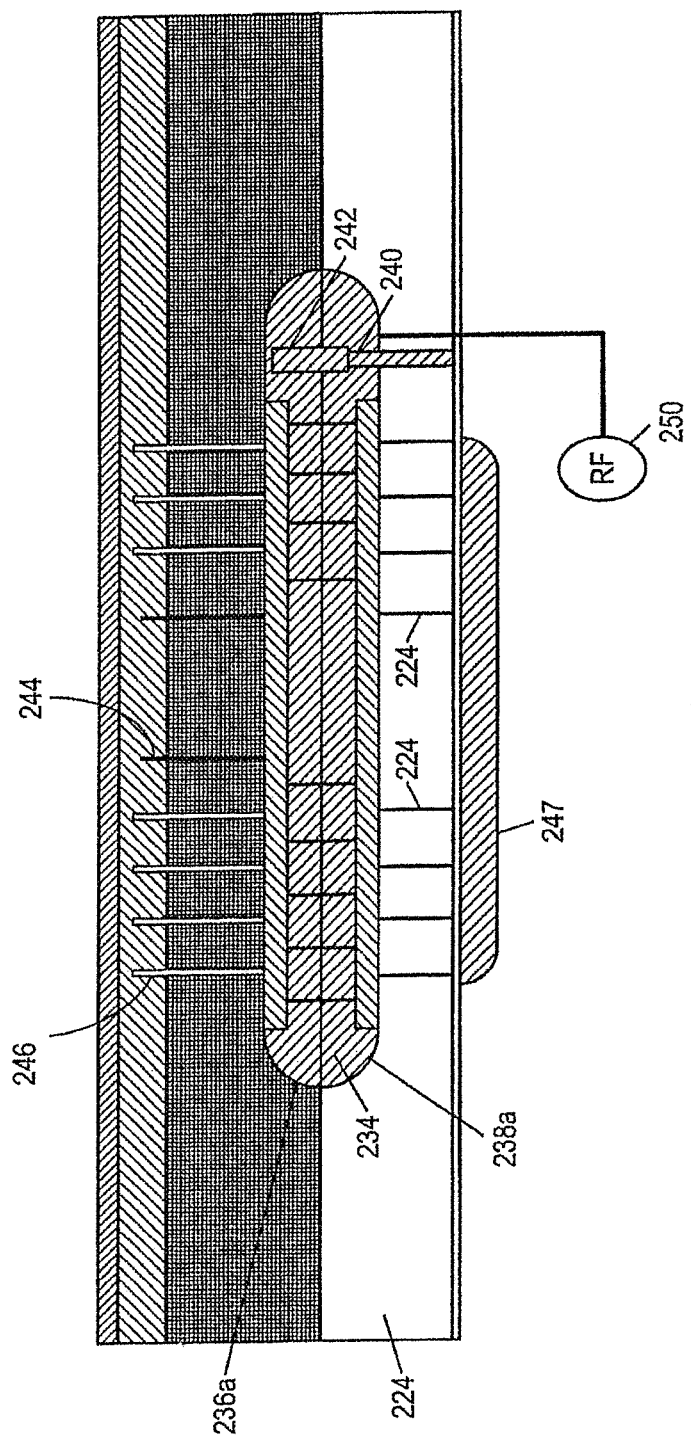
FIG. 4 illustrates a cut-away view of the first arrangement of an electrostatic chuck assembly and control electronics.

FIG. 4 illustrates a cut-away view of the first arrangement of an electronic chuck assembly and control electronics which can be used to power the multi-plane heater.

As shown in FIG. 4, the distribution board 228 and the switching electronics board 226 are disposed in the enclosed volume 234 between the facilities plate 224 and the baseplate 206. The enclosed volume 234 is formed through an alignment of a recess 236 in the bottom surface of the baseplate 206 and a recess 238 in the top surface of the facilities plate 224. The outer surfaces (e.g. edges) 236a, 238a of the baseplate 206, and the facilities plate 224, respectively forming sidewalls of the enclosed volume 234. An alignment pin 240 is used to align the baseplate 206 and the facilities plate 224 during assembly. The alignment pin 240 extends from the facilities plate 224 and mates with a receptacle 242 extending from the baseplate 206. Power is supplied to the primary heating layer 205 through power supply line 244, and to the multi-plane heater 203 through supply lines 246. RF power can be supplied to the facilities plate 224 through RF supply 250.

Each of the supply lines 244 and 246 extends through (e.g., penetrates) the baseplate 206 with the supply lines 244 terminating at the primary heating layer 205 and the distribution board 228 and the supply lines 246 terminating at the multi-plane heater 203 and the distribution board 228.

As already discussed, the distribution board 228 is attached to a bottom surface of the baseplate 206 within the enclosed volume 234. The switching electronics board 226 is attached to a top surface of the facilities plate 224 within the enclosed volume 234. The distribution board 228 and the switching electronics board 226 are electrically connected so that the switching device 221 of the switching electronics board 226 can supply power to one of the power supply lines and one of the power return lines so as to provide time-averaged power to each of the thermal control elements by time divisional multiplexing of a plurality of switches.

The switching electronics board 226 includes transistors on at least one of its surfaces. Each transistor corresponds to one of the plurality of switches of the switching circuit 222, and can include metal oxide field effect transistors (MOSFET), power switching FETs, or any other suitable transistor as desired. In an exemplary embodiment, the switching devices can be MOSFETs that extend from the surface of the switching electronics board 226 through a top surface of the facilities plate 224 to a bottom surface of the facilities plate 224, which acts as a heat sink to cool the transistors. The facilities plate 224 includes a plurality of holes that extend from the first surface to the second surface and each hole is configured to receive one of the MOSFETs. A sealing member 247, such as at least one sealing cap, can be attached to the bottom surface of the facilities plate 224 and at a location where the plurality of vertical MOSFETs terminate. The sealing member 247 provides a barrier and enclosure that protects the MOSFETs from RF.

Figure 5:
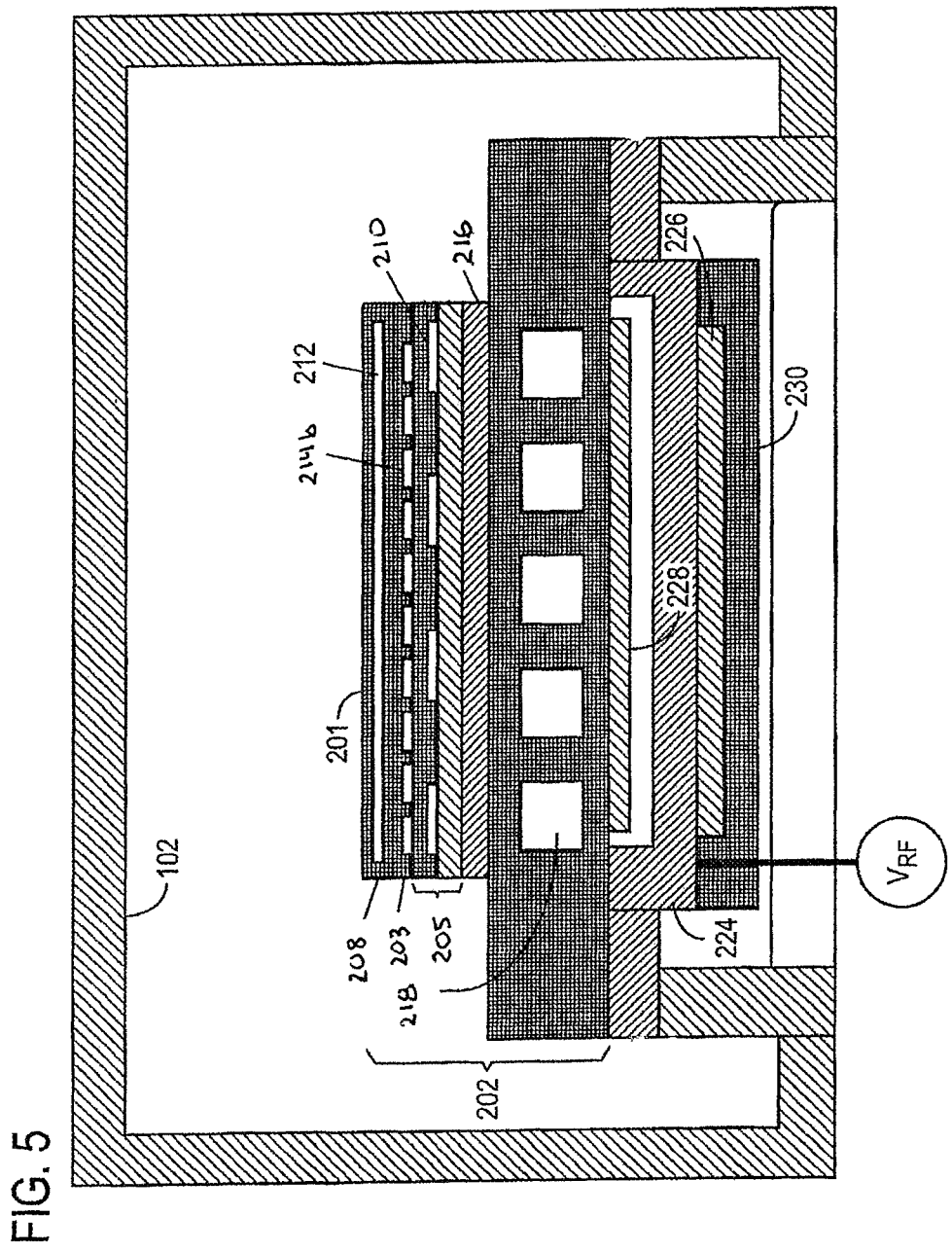
FIG. 5 illustrates a schematic diagram of a second arrangement of an electrostatic chuck assembly and control electronics.

FIG. 5 illustrates a schematic overview of an arrangement of an electrostatic chuck assembly and control electronics for activating the thermal control elements. The exemplary arrangement shown in FIG. 5 has substantially the same ESC assembly 202 configuration as illustrated in FIG. 2. Regarding the control electronics, however, the switching electronics board 226 is formed on a lower surface of the facilities plate 224. A metal cage 230 can be formed over the switching electronics board 226 to enclose the switching electronics board 226 within a volume between the metal cage 230 and the facilities plate 224. The switching electronics board 226 is electrically connected to the facilities plate 224, which is metal or metal coated, such that the enclosed volume 234 establishes a Faraday cage that protects the board electronics from RF noise. For example, as already discussed the switching electronics board 226 can be a multilayer board having a common voltage plane 227 connected to the facilities plate 224. The metal cage 230 can be attached (e.g., electrically connected) to the outside surface of the facilities plate 224 via screws or other suitable attaching means, so that the switching electronics board 226 is fully enclosed within the metal cage 230.

Figure 6:
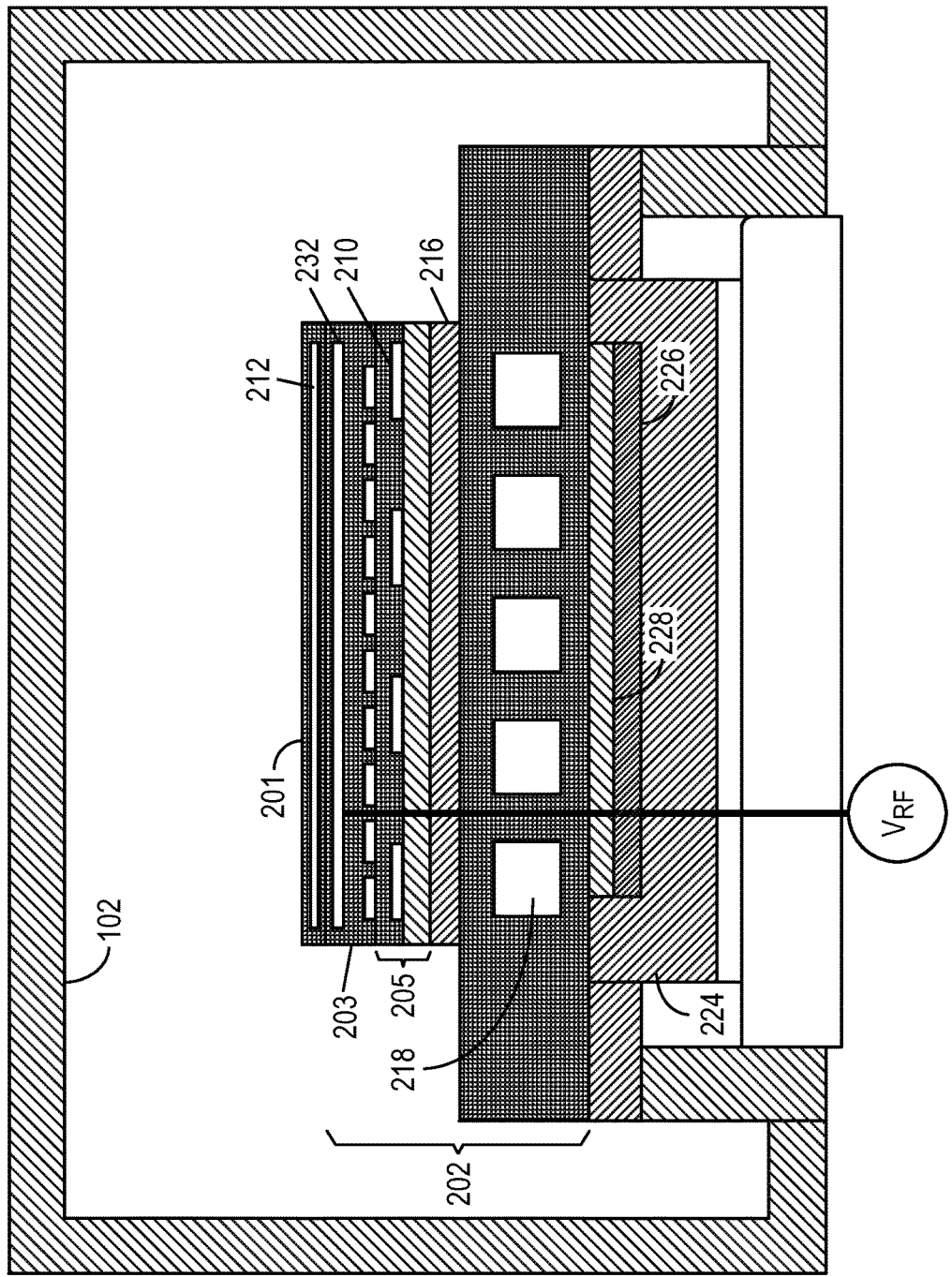
FIG. 6 illustrates a schematic diagram of a third arrangement of an electrostatic chuck assembly and control electronics.

FIG. 6 illustrates a schematic overview of another arrangement of an electrostatic chuck assembly and control electronics for activating the thermal control elements. As shown in FIG. 6, the ceramic layer 208 of the ESC assembly 202 includes the clamping electrode 212 and an RF electrode 232. In this exemplary embodiment, the RF source is connected to the RF electrode 232. This arrangement is advantageous in that it reduces the amount of RF coupled to the primary heating layer 205 and the multi-plane heater 203.

Figure 7:
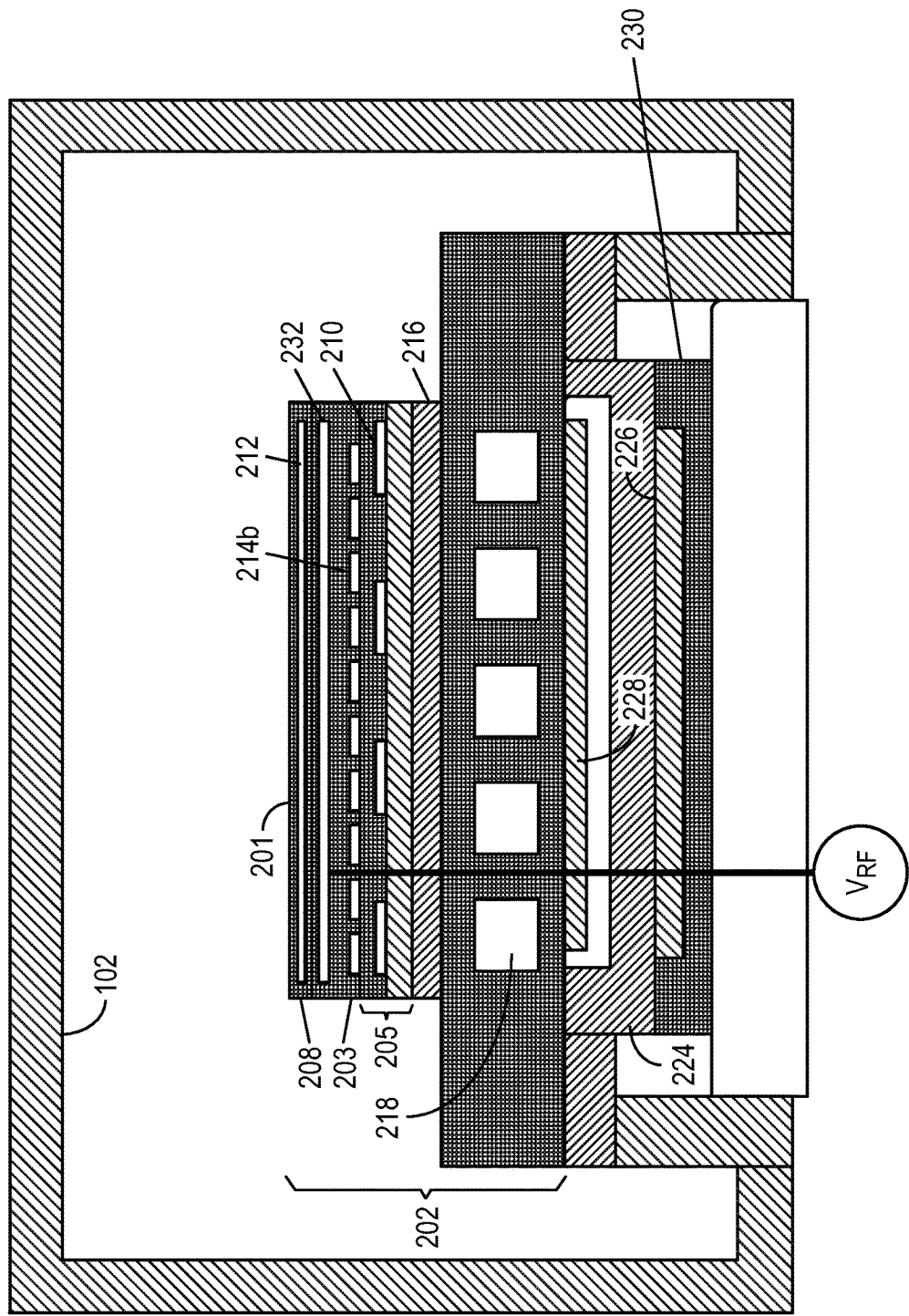
FIG. 7 illustrates a schematic diagram of a fourth arrangement of an electrostatic chuck assembly and control electronics.

FIG. 7 illustrates a schematic overview of a further arrangement of an electrostatic chuck assembly and control electronics for activating the thermal control elements. FIG. 7 shows another exemplary embodiment of the arrangement of FIG. 5, where the exemplary arrangement of FIG. 7 includes the RF electrode 232 in the ceramic layer 208, and the RF source providing RF power to the RF electrode 232.

Figure 8A:
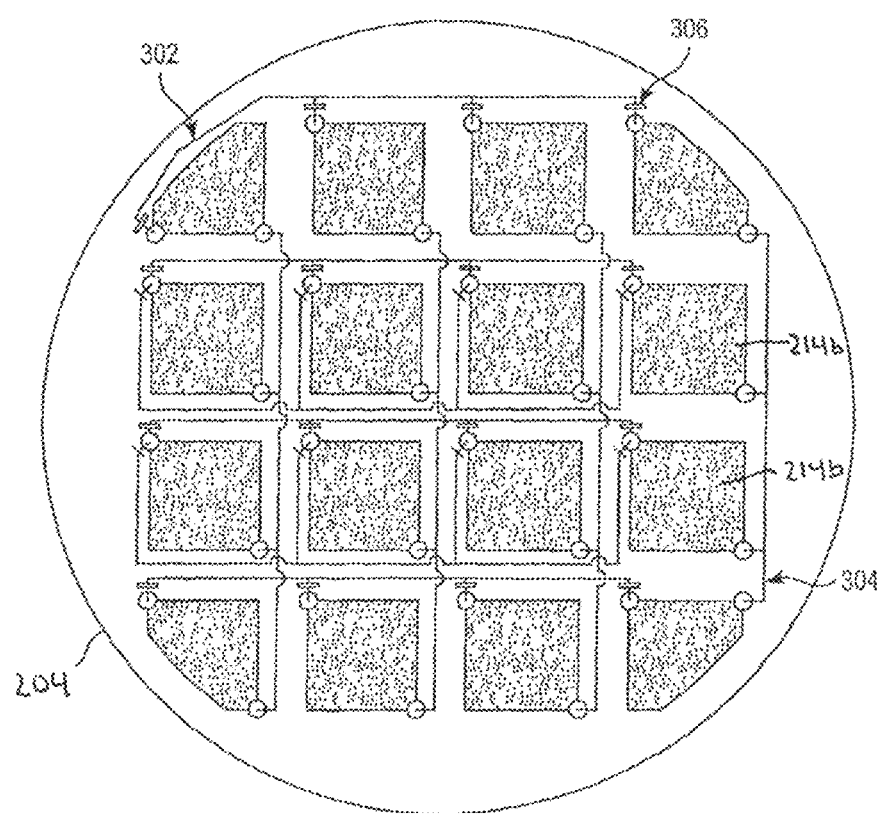
FIG. 8A illustrates one layer of the multi-plane heater of a substrate support assembly.

FIG. 8A illustrates a plane of the multi-plane heater 203 of a substrate support assembly wherein the ESC assembly 202 includes an array of thermal control elements 214b powered through a connection to two or more power supply lines 302 and two or more power return lines 304. Each power supply line is connected to at least two of the thermal control elements 214b and each power return line is connected to at least two of the thermal control elements 214b. No two local thermal control elements 214b share the same pair of power supply 302 and power return 304 lines. By suitable electrical switching arrangements, it is possible to connect a pair of power supply 302 and power return 304 lines to a power supply (not shown), whereby only the thermal control element 214b connected to this pair of lines is turned on. For example, each thermal control element 214b defining a local heater zone can be addressable by the switching electronics board 226 to provide power to an associated thermal control element 214b at a specified timing. The time-averaged heating power of each thermal control element 214b can be individually tuned by time-domain multiplexing. In order to prevent crosstalk between different thermal control elements 216, a diode 306 can be serially connected between each thermal control element 214b and the power supply line 302, or between each thermal control element 216 and the power return line 304.

While FIG. 8A shows thermal control elements 214b, each pair of vertically offset heating elements 214/214a is similarly powered by power supply and return lines which are connected to pairs of heating elements 214/214a such that each pair of vertically offset heating elements 214/214a is connected to a different pair of power supply and return lines.

In an exemplary embodiment, the primary heating plate 205 can include a central heater and three concentric heaters surrounding the central heater. The multi-plane heater 203 can include an array of thin film resistance heaters which in the case of a substrate support for electrostatically clamping a 300 mm wafer thereon can include 16-25, 26-49, 50-100, 100-200, 200-300, 300-400 or more heating elements. As a result, at locations above each thermal control element 214/214a, 214b, the substrate temperature, and consequently a plasma etching process, can be controlled to maximize the yield of devices from the substrate. The scalable architecture of the multi-plane heater 203 can readily accommodate any number of local thermal control elements 214/214a, 214b as specified for die-by-die substrate temperature control. A detailed description of an ESC assembly for a substrate support assembly in a semiconductor processing apparatus with multiple independently controllable planar thermal control elements is disclosed in commonly-assigned U.S. Patent Publication Nos. 2011/0092072 and 2011/0143462, the disclosures of which are hereby incorporated by reference.

Figure 8B:
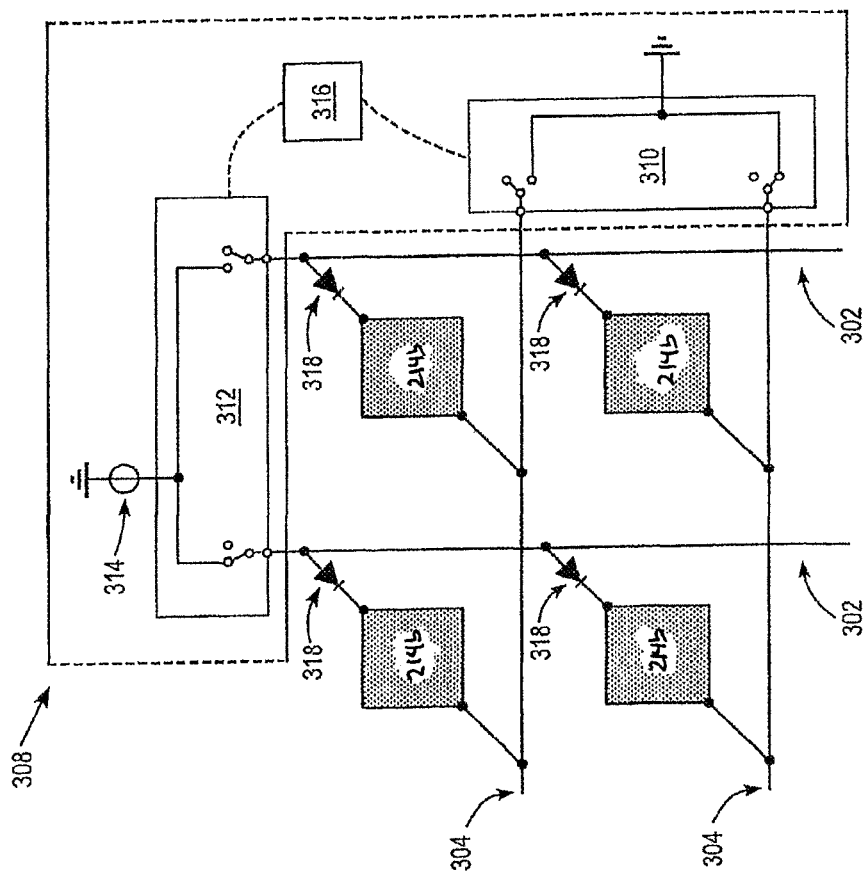
FIG. 8B illustrates a timing circuit for controlling the multi-plane heater.

FIG. 8B illustrates a schematic overview of a timing circuit for controlling the thermal control elements wherein the power switching circuit 221 is configured to control and power each thermal control element 214/214a, 214b in the multi-plane heater 203 to generate a desired temperature profile. For simplicity, only four thermal control elements 214b are shown. It should be understood that the thermal array could include any number of thermal control elements suitable for obtaining the desired surface temperature profile of the ESC assembly 202.

The power switching circuit 221 includes switching devices 310 connected to each of the power return lines 304, and switching devices 312 connected to each of the power supply lines 302. The switching devices 312 can connect each power supply line 302 to a power source (e.g., power supply) 314 or electrically isolate the power supply lines 302 from the power source 314. The switching device 310 can connect each power return line 304 to the electrical ground or electrically isolate the return line from ground or from the low voltage side of the power source 314. A processor 316 of the control circuit 223 (e.g. a micro controller unit, a computer, etc.) controls the switching devices 310 and 312. A thermal control element 214/214a, 214b is powered, for example, when and only when the power supply line 302 connected to the respective thermal control element 214/214a, 214b is connected to the high voltage side of the power source 314 and the power return line 304 connected to this thermal control element 214/214a, 214b is connected to the electrical ground or the low voltage side of the power source. To prevent crosstalk between each thermal control element 214/214a, 214b, a diode 318 can be serially connected between each thermal control element and the power supply lines 302 connected thereto, or between each thermal control element and the power return lines 304 connected thereto. The switching devices can be transistors such as a metal oxide field effect transistor (MOSFET), a power switching FET, or any other suitable transistor switch as desired.

The power switching circuit 221 further includes one or more temperature sensors configured to monitor temperature of respective locations on the distribution or switching electronics board 226 and/or the temperature of board components. The locations of the temperature sensors and the locations of each thermal control element 214/214a, 214b may or may not coincide. The temperature of each thermal control element can be obtained or estimated by actual measurements, calibration, or calculation based on a theoretical or empirical model. For example, the estimated measurement can be based on a calibrated estimate, predictive estimate, or modeled estimate.

To activate a respective thermal control element 214/214a, 214b, the control circuit 223 calculates a duty cycle for each thermal control element based on a setpoint temperature of the thermal control element. The setpoint temperature of each thermal control element is determined by a desired temperature profile of the entire heating plate. In a time-domain multiplexing scheme, the control circuit 223 controls the timing of the switching circuit 221 to maintain a connection between one power supply line 302 at a time and the power supply 314 for a time duration T, during which the switching circuit 221 maintains a connection between the electrical ground or the low voltage terminal of the power source and each of the thermal control elements connected to the one power supply line 302 for the time duration $\tau_i$, where i indicates each of the thermal control elements. The $\tau_i$ for each of the thermal control elements may not necessarily be the same value because each heater zone may have a different temperature setpoint and therefore require a different power duty cycle. If the power supply 314 outputs a constant DC voltage $V_0$ and all the thermal control elements have a same electrical resistance $R_0$, and the array has N power supply lines 302 then the average heating power of a thermal control element is proportional to the ratio $$\frac{\tau_i}{TN}.$$

The control circuit 223 starts the time duration $\tau_i$ for each thermal control element at the beginning of the time duration T, which however leads to a peak in the total current carried by the one power supply line 302 at the beginning of the time duration T. Advantageously, in a time-domain multiplexing scheme according to an embodiment, the controller can temporally spread the beginnings of the time durations $\tau_i$ across the time duration T, i.e. not starting all the time durations $\tau_i$ at the same time, so as to decrease the maximum total current the one power supply line 302 carries throughout the time duration T.

Figure 9:
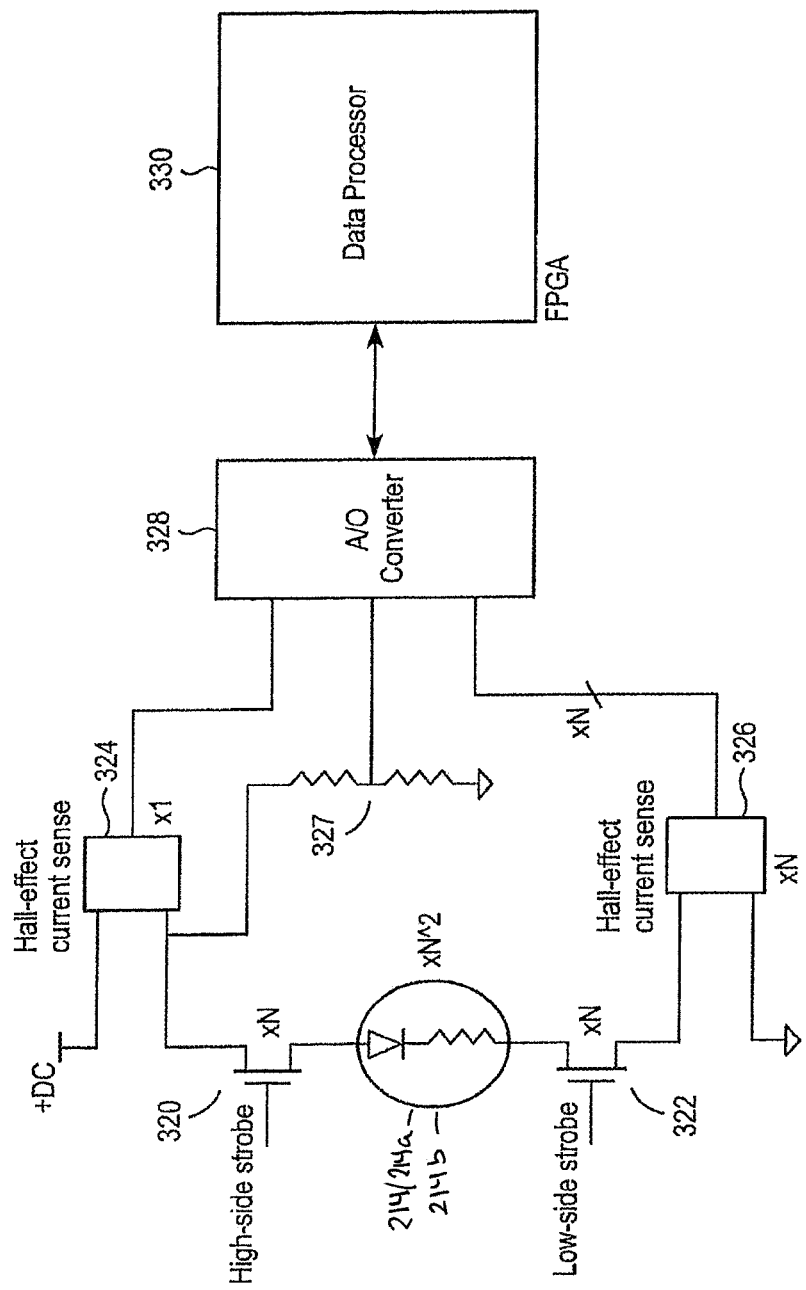
FIG. 9 illustrates a circuit diagram of a control circuit for controlling and monitoring the thermal control elements.

FIG. 9 illustrates a circuit diagram of a control circuit for controlling and monitoring the thermal control elements in accordance with an exemplary embodiment. As shown in FIG. 9, each thermal control element 214/214a, 214b is connected between high-voltage side and low-voltage side transistors 320, 322. The high-voltage side transistor 320 has its drain connected to a current sensor 324, such as a Hall Effect current sensor, which is also connected to DC power. The low-voltage side transistor 322 has a drain connected to the thermal control element 214/214a, 214b and its source connected to a current sensor 326, such as a Hall-effect current sensor, which is also connected to ground. When the thermal control element is addressed by the control circuit 223, the gates of the high-voltage and low-voltage side transistors are strobed to activate (e.g., heat/cool) the thermal control element. The output of each current sensor 324, 326 is provided to a voltage sampling/Analog-to-Digital (A/D) converter 328 on the switching electronics board 226. A voltage divider circuit 327 connected to the drain of the high-side transistor 320 also provides an output to the A/D converter 328. The output of the A/D converter 328 is provided to the processor 316, such as a programmable logic device, field programmable gate array (FPGA), or other suitable processing device as desired. The processor 316 processes the received data to determine the instantaneous current flowing through each thermal control element 214/214a, 214b, the instantaneous total current on the DC supply, and the voltage on the DC supply. These values can be stored in processor memory, memory on the switching electronics board 226, or the distribution board 228.

Figure 10:
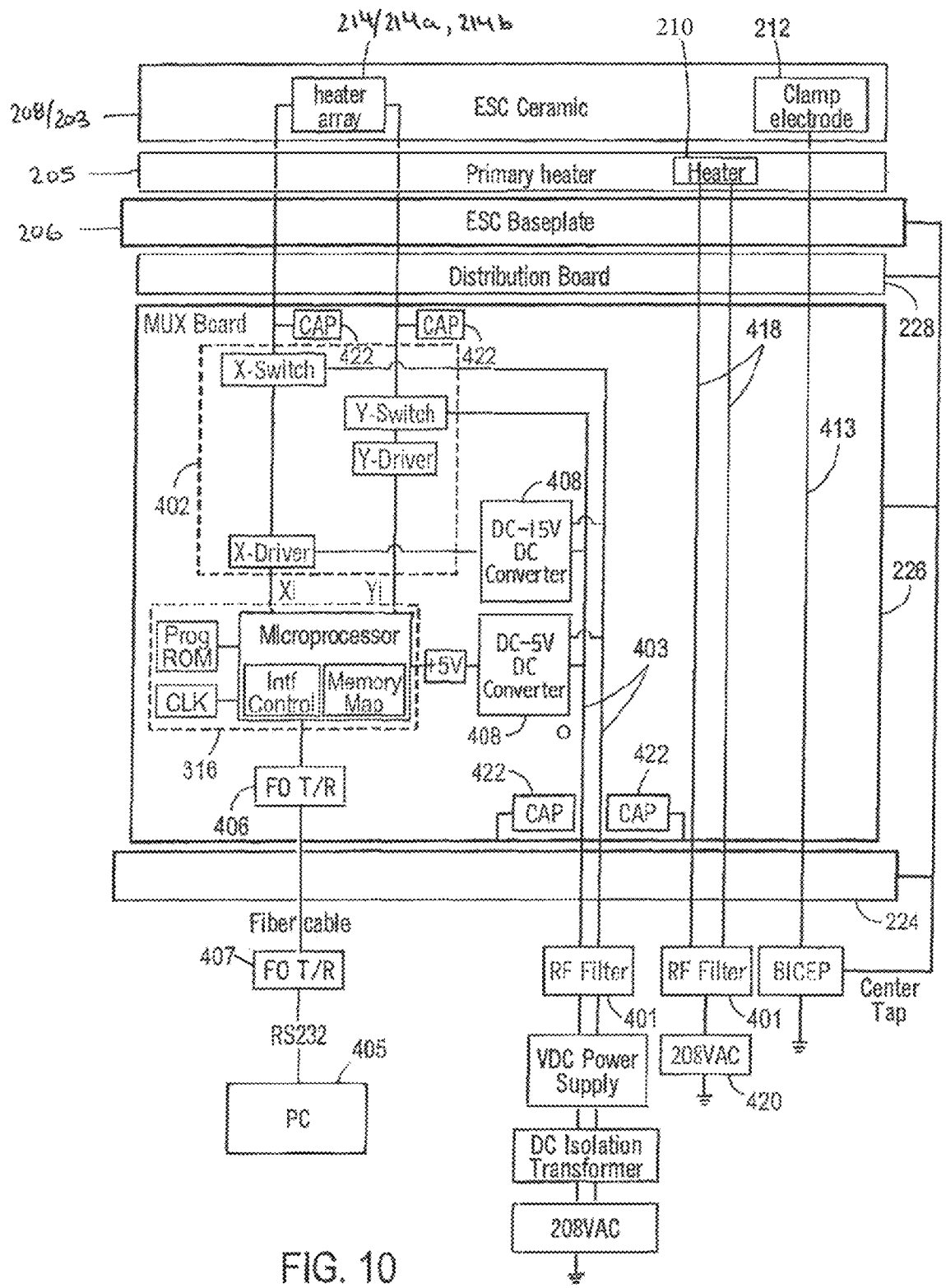
FIG. 10 illustrates a schematic diagram of control electronics of a switching electronics board.

FIG. 10 illustrates a schematic diagram of control electronics of a power distribution assembly in wherein the switching and control circuits 222, 223 are disposed on a switching electronics board 226, which is connected to the distribution circuit disposed on a distribution board 228. It should be understood that in another exemplary embodiment the switching, control, and power distribution circuits 222, 223, 219, could be disposed on the distribution board 228 such that power distribution assembly includes only one circuit board in the enclosed volume 234 between the baseplate 206 and the facilities plate 224.

As shown in FIG. 10, the switching electronics board 226 is arranged to receive DC power and provide the power selectively to each element of the array of thermal control elements 214/214a, 214b as needed to control the temperature at the substrate support surface 201 of the ESC ceramic layer 208. In an exemplary embodiment, the switching electronics board 226 can include a connection for receiving power from a DC power supply via an RF filter 401 via two power lines 403 (e.g., supply and return lines), the supplied DC power being rated at the operating voltage of the thermal control elements 214/214a, 214b of the ESC ceramic layer 208. The switching electronics board 226 also includes a power switching device 402, such as a power transistor, such as a metal-oxide semiconductor field effect transistor (MOSFET) or other suitable transistor as desired, connected to each of the power lines 403 for providing power to the array of thermal control elements. The switching electronics board 226 provides switched DC power to the ESC assembly 202 via the distribution board 228.

As discussed with respect to FIG. 8B, the processor 316 of the control circuit provides control signals to the switching devices 402 of the switching circuit so that each thermal control element, can be individually addressed to generate heat at the support surface 201 of the ESC ceramic layer 208 as desired. The switching electronics board 226 conditions the DC power received from the DC power source via the RF filter over two power supply lines. DC power is supplied from the switching electronics board 226 to the thermal control elements via the distribution board 228. The switching electronics board 226 is connected to receive the DC power such that the control electronics for the multi-plane heater 203 and/or the primary heating layer 205 are shielded in an enclosure inside the plasma processing chamber and connected on a high RF voltage side of the RF filter, one of the two power supply lines 403 having a positive potential and the other supply line having a negative or lower potential. Because the switching electronics board 226 receives only two input power lines for DC power, the number of connections specified for RF filtering is reduced, which in turn reduces the size, cost and complexity of the RF filtering for the power supply lines 403 from the switching electronics board 226 to the ESC ceramic layer 208.

The switching electronics board 226 can also include communication circuitry 406, such as an optical transmitter and receiver, for establishing data communication between the processor 316 and an external processor 405 (e.g., external communication device), such as a computer or other suitable control device as desired, over optical fiber 407. In another exemplary embodiment, the communication circuitry 406 can be configured to communicate over a wireless channel, such as, over selected RF frequencies. The communication circuitry 406 should be configured so that command and control signals communicated between the processor 316 of the switching electronics board 226 and the external processor 405 are isolated from active RF inside the plasma processing chamber. In another exemplary embodiment, this isolation can be achieved using isolation transformers, optocouplers, RF transceivers operating at a different frequency from the active RF in the plasma processing chamber, Wi-Fi transceivers, or any other suitable communication arrangement as desired. In still another exemplary embodiment, the communication circuitry 406 can be configured to communicate over a hard-wired communication channel. In a wired channel, additional filtering components can be used for RF, DC, and/or galvanic isolation such that the communication signals are isolated and immune to RF interference.

The switching electronics board 226 can include logic for encrypting and decrypting control or status messages communicated with the external processor 405. The switching electronics board 226 includes DC-to-DC converters 408 for stepping down voltages received from the two power lines 403. Each of the DC-to-DC converters 408 providing stepped down voltages to the processor 316 and the switching devices 402, for example. Sensors 410 can be strategically mounted as desired on the switching electronics board 226 to detect board temperature and/or the temperature of specified board components. Each sensor 410 is connected to provide an output to the processor 316, which stores the received signals in memory. In an exemplary embodiment, the output of the sensors can be stored in memory on the switching electronics board 226 and/or the distribution board 228. Temperatures of components external to the switching electronics board 226, such as, the ESC assembly 202 or the baseplate 206, for example, can be monitored and recorded by sensors 412.

Via the connection with the distribution board 228, the switching electronics board 226 can include electrical components and circuits for passing DC or AC power from an external power source to circuitry in the ESC assembly 202. For example, in an exemplary embodiment, the switching electronics board 226 can be configured to include a conductive trace or supply line 414 to pass DC power from an external DC source 416 through the distribution board 228 to the electrostatic clamping electrode 212 embedded in the ESC ceramic layer 208. In another exemplary embodiment, the switching electronics board 226 can be configured to include a conductive trace or supply line 418 to pass AC-power from an external AC source 420 through the distribution board 228 to the primary heaters 210 disposed in the primary heating layer 205 of the ESC assembly 202.

As already discussed, to shunt RF current from the thermal control elements 214/214a, 214b of the ESC assembly 202 away from the switching electronics board circuit and instead through the metal, or metal coated, facilities plate 224, capacitors 422 can be provided on the power input and output lines of the switching electronics board 226 in which one end of each capacitor 422 is connected to one of the power lines 403 and the other end of each capacitor 422 is connected to the facilities plate 224 or a common voltage plane (e.g. common conductive plane) on the PCB, which is connected to the facilities plate such that the common voltage plane and the facilities plate are at the same electrical potential. The use of capacitors 422 on the switching electronics board 226 in this manner reduces the risk that RF voltage on the switching electronics board 226 interferes with the operation of the electronic circuitry (switching devices 402, processor 316, power converters 408, or other suitable component as desired) also located thereon.

In an exemplary embodiment, the switching electronics board 226 can include voltage and/or current sensors 423 for monitoring voltages/currents on incoming data lines and bus circuits (see FIG. 9). The processor 316 can be configured to modify current or voltage outputs on the bus circuits based on changes in resistance or changes in an output of any of sensors 410, 412, or 423 as desired.

In another exemplary embodiment mentioned above, the processor 316 can be configured to perform real-time encryption and decryption of data communicated to an external device or processor. For example, data including control or status messages and data logging can be encrypted and/or decrypted during communication with an external device or processor. The processor can also include non-volatile resident or external memory for storing calibration data associated with the primary heaters 210 and the array of thermal control elements 214/214a, 214b of the ESC assembly 202. The processor 316 can be configured to receive software updates or be reprogrammed from an external device or processor via the communication circuitry 406. In another exemplary embodiment, the data stored in memory can be password protected to prevent unauthorized access to the processor and its content.

Figure 11:
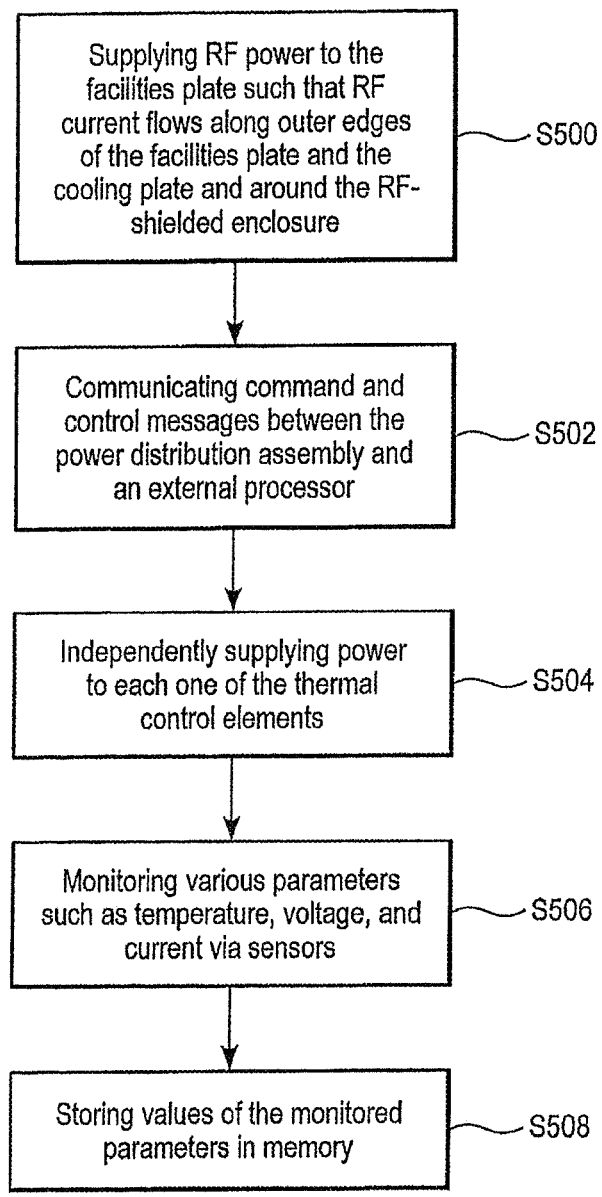
FIG. 11 is a flow diagram of a method of etching a semiconductor substrate in a plasma processing chamber.

FIG. 11 is a flow diagram of a method of etching a wafer in a plasma processing chamber in accordance with an exemplary embodiment of the present disclosure.

As already discussed through preceding FIGS. 1-10, the plasma processing chamber 102 includes an electrostatic chuck assembly 202 for supporting a substrate during plasma processing. The electrostatic chuck assembly 202 includes a baseplate 206 and an array of thermal control elements 214/214a, 214b operable to tune a spatial temperature profile on the semiconductor substrate. The thermal control elements are individually powered by two or more power supply lines 302 and two or more power return lines 304 wherein each power supply line 302 is connected to at least two of the thermal control elements and each power return line 304 is connected to at least two of the thermal control elements. The electrostatic chuck assembly 202 is mated to a power distribution assembly 211 via the baseplate 206. The power distribution assembly 211 includes a power distribution circuit 219 connected to each power supply line 302 and power return line 304 of the heater array and a power switching device 221 is connected to the power distribution circuit 219. As already discussed, the electrostatic chuck assembly 202 also includes a facilities plate 224. The power distribution assembly 211 is mounted to at least the cooling plate 210 within an RF-shielded enclosure between the baseplate 206 and the facilities plate 224.

As shown in FIG. 11, during operation RF power is supplied to the electrostatic chuck assembly via the facilities plate 224 such that RF current flows along outer surfaces of the facilities plate and the cooling plate and around the RF-shielded enclosure (S500). When RF power is supplied to the electrostatic chuck assembly an RF potential of the power distribution circuit 219 matches an RF potential of the facilities plate 224 (S504). Command and control messages are communicated between the control circuit 223 of the power distribution assembly within the plasma processing chamber and a processor 405 external to the plasma processing chamber (S502). Based on the command and control messages, the switching circuit 222 can be commanded to independently supply power to each one of the thermal control elements via one of the power supply lines and one of the power return lines to provide time-averaged power to each of the thermal control elements by time-divisional multiplexing of the plurality of switches (S506). The power distribution assembly 211 monitors various parameters such as temperature, voltage, and current via sensors (S508), and stores values associated with monitored parameters in memory (S510).

Although the disclosure has been presented in reference to the attached figures and specification, the disclosure is by no means limited to those as the disclosure is subject to variations within the scope allowed for by the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A multi-plane heater of a semiconductor substrate support for supporting a semiconductor substrate in a plasma processing chamber, the multi-plane heater comprising:
a first resistance heating element;
a second resistance heating element; and
a body of dielectric material containing the first resistance heating element and the second resistance heating element,
wherein
the first resistance heating element is vertically offset from and electrically connected in series with the second resistance heating element such that the first resistance heating element and the second resistance heating element form an individually addressable thermal control element and such that the first resistance heat element and the second resistance heat element are capable of being powered as a unitary structure without powering another resistance heat element of the multi-plane heater.

2. The multi-plane heater of claim 1, wherein:
the first resistance heating element is located on an outer portion of a first layer of dielectric material;
the second resistance heating element is located on an outer portion of a second layer of dielectric material;
the first layer of dielectric material and the second layer of dielectric material are bonded to a third layer of dielectric material with the first resistance heating element embedded in the first layer of dielectric material and the second resistance heating element embedded in the second layer of dielectric material; and
the first resistance heating element and the second resistance heating element comprise planar resistance heaters having the same size.

3. The multi-plane heater of claim 2, wherein:
the first resistance heating element and the second resistance heating element are on layers of dielectric ceramic material with discrete electrically resistive traces;
the discrete electrically resistive traces include the first resistance heating element and second resistance heating element;
the first layer of dielectric material and the second layer of dielectric material are bonded to at least one additional layer of dielectric material with electrically conductive vias;
the electrically conductive vias connect the first resistance heating element and the second resistance heating element in series; and
the first resistance heating element and the second resistance heating element comprise laminates of electrically resistive material encapsulated in polymeric material.

4. A semiconductor substrate support comprising:
an electrostatic clamping layer including at least one electrostatic clamping electrode, wherein the at least one electrostatic clamping electrode is configured to electrostatically clamp a semiconductor substrate on a support surface of the substrate support;
a multi-plane heater comprising a body of dielectric material, wherein the body of dielectric material includes a first resistance heating element and a second resistance heating element, wherein the first resistance heating element is vertically offset from the second resistance heating element, wherein the first resistance heating element and the second resistance heating element are electrically connected in series such that the first resistance heating element and the second resistance heating element form a first individually addressable thermal control element and such that the first resistance heat element and the second resistance heat element are capable of being powered as a unitary structure without powering another resistance heat element of the multi-plane heater; and
a temperature controlled base plate beneath the multi-plane heater.

5. The semiconductor substrate support of claim 4, further comprising:
(a) a primary heater layer including at least one primary heating element, wherein the at least one primary heating element is configured to provide temperature control of the support surface, and wherein the multi-plane heater is located between the primary heater layer and the electrostatic clamping layer;
(b) a heater array of individually controlled resistive heating elements operable to tune a spatial temperature profile of the semiconductor substrate, wherein the multi-plane heater comprises a primary heater, which provides temperature control of the support surface of the substrate support; or
(c) the base plate receives a radio frequency signal, wherein the first resistance heating element and the second resistance heating element are arranged in a manner which minimizes a net magnetic field generated in a direction parallel to a plane of the support surface as a result of receiving the radio frequency signal.

6. The semiconductor substrate support of claim 4, further comprising:
a third resistance heating element vertically offset from and connected in series with a fourth resistance heating element such that the third resistance heating element and the fourth resistance heating element form a second individually addressable thermal control element;
a fifth resistance heating element vertically offset from and connected in series with a sixth resistance heating element such that the fifth resistance heating element and the sixth resistance heating element form a third individually addressable thermal control element;
a seventh resistance heating element vertically offset from and connected in series with an eighth resistance heating element such that the seventh resistance heating element and the eighth resistance heating element form a fourth individually addressable thermal control element; and
power supply lines and power return lines configured to deliver power to the first individually addressable thermal control element, the second individually addressable thermal control element, the third individually addressable thermal control element and the fourth individually addressable thermal control element,
wherein
each of the power supply lines is connected to at least two of the first individually addressable thermal control element, the second individually addressable thermal control element, and the third individually addressable thermal control element,
each of the power return lines is connected to at least two of the first resistance heating element, the second resistance heating element, the third resistance heating element, the fourth resistance heating element, the fifth resistance heating element, the sixth resistance heating element, the seventh resistance heating element and the eighth resistance heating element, and
each of the first individually addressable thermal control element, the second individually addressable thermal control element, and the third individually addressable thermal control element is connected to a different pair of the power supply lines and the power return lines.

7. A multi-plane heater of a semiconductor substrate support for supporting a semiconductor substrate in a plasma processing chamber, the multi-plane heater comprising:
a heater array comprising independently controlled heating elements operable to tune a spatial temperature profile on the semiconductor substrate;
the heater array including a first layer of independently controlled heating elements and a second layer of independently controlled heating elements;
the first layer of heating elements including a first group of heating elements and a second group of heating elements, wherein the first group of heating elements is vertically offset from the second group of heating elements of the second layer of heating elements; and
the heating elements of the first group of heating elements are respectively connected to the heating elements of the second group of heating elements such that each pair of vertically offset heating elements is an individually addressable thermal control element and such that each of the pairs of vertically offset heating elements is capable of being powered as a unitary structure without powering another resistance heat element of the multi-plane heater, wherein each pair of vertically offset heating elements includes one of the heating elements in the first group of heating elements and one of the heating elements in the second group of heating elements.

8. The multi-plane heater of claim 7, wherein:
(a) the first layer of heating elements includes a third group of heating elements, wherein the first group of heating elements and the third groups of heating elements comprise planar heaters, and wherein the planar heaters of the third group of heating elements has a larger size than the planar heaters of the first group of heating elements;
(b) the first group of heating elements and the second group of heating elements comprise planar resistance heaters, wherein the planar resistance heaters of the first group of heating elements have the same size as the planar resistance heaters of the second group of heating elements;
(c) all of the heating elements of the second layer of heating elements are located in an annular zone at an outer periphery of the second layer of heating elements and an inner portion of the second layer of heating elements is free of heating elements; or
(d) the first layer of heating elements comprises traces of electrically resistive heating material forming individually powered heating zones on a first layer of dielectric material, wherein the second layer of heating elements comprises traces of electrically resistive heating material forming individually powered heating zones on a second layer of dielectric material, and wherein the first layer of dielectric material and the second layer of dielectric material are bonded to an electrostatic clamping layer including at least one electrostatic clamping electrode.

9. The multi-plane heater of claim 8, wherein:
the first group of heating elements is located on an outer portion of the first layer of dielectric material;
the second group of heating elements is located on an outer portion of the second layer of dielectric material; and
the third group of heating elements is located in a central portion of the first layer of dielectric material.

10. The multi-plane heater of claim 9, wherein:
(a) the first layer of heating elements and the second layer of heating elements are on layers of dielectric ceramic material with discrete electrically resistive traces, wherein the discrete electrically resistive traces include the heating elements in the first layer of heating elements and the second layer of heating elements, wherein the first layer of dielectric material and the second layer of dielectric material are bonded to at least one additional layer of dielectric material, and wherein the at least one additional layer of dielectric material include electrically conductive vias connecting the heating elements in the first group of heating elements and the second group of heating elements; and
(b) the heating elements in the first group of heating elements and the second group of heating elements comprise laminates of electrically resistive material encapsulated in polymeric material.

11. The multi-plane heater of claim 10, wherein:
(a) each pair of vertically offset heating elements is electrically connected in parallel by a pair of electrically conductive vias extending through the at least one additional dielectric layer; or
(b) each pair of vertically offset heating elements is electrically connected in series by an electrically conductive via extending through the at least one additional dielectric layer.

12. A semiconductor substrate support comprising:
an electrostatic clamping layer including at least one electrostatic clamping electrode, wherein the at least one electrostatic clamping electrode is configured to electrostatically clamp a semiconductor substrate on a support surface of the substrate support;
a multi-plane heater comprising a heater array, wherein the heater array comprises independently controlled heating elements, wherein the independently controlled heating elements are operable to tune a spatial temperature profile on the semiconductor substrate, wherein the heater array includes a first layer of independently controlled heating elements and a second layer of independently controlled heating elements, wherein the first layer of independently controlled heating elements include a first group of heating elements vertically offset from a second group of heating elements of the second layer of independently controlled heating elements such that each of the pairs of vertically offset heating elements is powered as a unitary structure without powering another resistance heat element of the multi-plane heater, wherein the heating elements of the first group of heating elements are electrically connected to the heating elements of the second group of heating elements such that each pair of vertically offset heating elements is an individually addressable thermal control element; and
a temperature controlled base plate beneath the multi-plane heater.

13. The semiconductor substrate support of claim 12, further comprising a primary heater layer including at least one primary heating element, wherein the primary heating element is configured to provide temperature control of the support surface, and wherein the multi-plane heater is located between the primary heater layer and the electrostatic clamping layer.

14. The semiconductor substrate support of claim 13, wherein the primary heater layer includes an inner primary heater, an outer primary heater and at least one intermediate primary heater between the inner primary heater and the outer primary heater.

15. The semiconductor substrate support of claim 12, wherein:
the base plate receives a radio frequency signal; and
the independently controlled heating elements are arranged in a manner which minimizes a net magnetic field generated in a direction parallel to a plane of the support surface due to reception of the radio frequency signal.

16. The semiconductor substrate support of claim 13, wherein:
the first layer of heating elements includes a third group of heating elements;
the first group of heating elements and the third group of heating elements comprise planar heaters; and
the planar heaters of the third group of heating elements have a larger size than the planar heaters of the first group of heating elements and are located inwardly of the first group of heating elements.

17. The semiconductor substrate support of claim 16, wherein:
the third group of heating elements includes concentrically arranged rings of heating elements; and
the first group of heating elements extends completely around an outermost annular portion of the first layer.

18. The semiconductor substrate support of claim 17, wherein the second layer of heating elements is between the first layer of heating elements and the primary heater layer.

19. The semiconductor substrate support of claim 12, further comprising power supply lines and power return lines, wherein:
   (a) all heating elements of the second layer of heating elements are located in an annular zone at an outer periphery of the second layer of heating elements and an inner portion of the second layer of heating elements is free of heating elements; and
   (b) the power supply lines and power return lines are configured to deliver power to each of the independently controlled heating elements, wherein each of the power supply lines is connected to at least two of the independently controlled heating elements and each of the power return lines is connected to at least two of the independently controlled heating elements.

20. The semiconductor substrate support of claim 12, wherein:
   the first layer of heating elements includes a third group of heating elements; and
   each heating element of the third group of heating elements is connected to a different pair of power supply lines and power return lines.

21. The multi-plane heater of claim 1, wherein:
   the body of dielectric material comprises:
      a first layer of dielectric material comprising the first resistive heating element, and
      a second layer of dielectric material comprising the second resistive heating element; and
   the first layer of dielectric material contacts the second layer of dielectric material.

22. The multi-plane heater of claim 21, wherein the first layer of dielectric material comprises a third resistance heating element, wherein the third resistance heating element provides another thermal control element independently addressable from the individually addressable thermal control element including the first resistance heating element and the second resistance heating element.

23. The multi-plane heater of claim 21, wherein:
   the body of dielectric material comprises a third layer of dielectric material comprising a third resistance heating element;
   the third layer of dielectric material contacts the second layer of dielectric material; and
   the third resistance heating element is vertically offset from the first resistance heating element and the second resistance heating element.

24. The multi-plane heater of claim 21, wherein:
   the first layer of dielectric material comprises a first plurality of resistance heating elements including the first resistance heating element;
   the second layer of dielectric material comprises a second plurality of resistance heating elements including the second resistance heating element;
   the second plurality of resistance heating elements are vertically disposed below and form a plurality of thermal control elements with respective ones of the first plurality of resistance heating elements;
   the plurality of thermal control elements are independently selectable; and
   the plurality of thermal control elements include the individually addressable thermal control element.

25. The multi-plane heater of claim 24, wherein the first layer of dielectric material comprises a third plurality of resistance heating elements that do not form thermal control elements with resistive heating elements in the second layer of dielectric material.

26. The multi-plane heater of claim 21, wherein the body of dielectric material comprises:
   a third layer of dielectric material disposed between the first layer of dielectric material and the second layer of dielectric material;
   the first layer of dielectric material comprises a first plurality of resistance heating elements connected in series, wherein the first plurality of resistance heating elements includes the first resistance heating element and a third resistance heating element; and
   a first via connecting the first resistance heating element and the second resistance heating element.

27. The multi-plane heater of claim 21, wherein:
   the body of dielectric material comprises a third layer of dielectric material disposed between the first layer of dielectric material and the second layer of dielectric material;
   the first layer of dielectric material includes a plurality of resistive heating elements;
   the plurality of resistive heating elements do not include the first resistive heating element and the second resistive heating element; and
   the third layer of dielectric material comprises
      a first line connected to a first one of the plurality of resistance heating elements; and
      a second line connected to a second one of the plurality of resistance heating elements.

28. The multi-plane heater of claim 21, wherein the body of dielectric material comprises:
   a third layer of dielectric material;
   a first via connecting a first line to a third resistance heating element, wherein the first layer of dielectric material includes the third resistance heating element, and wherein the third resistance heating element is connected in series with the first resistance heating element; and
   a second via connecting the first resistance heating element to the second resistance heating element.

29. The multi-plane heater of claim 28, wherein the body of dielectric material comprises:
   a fourth layer of dielectric material;
   the second layer of dielectric material comprises a fourth resistance heating element;
   the fourth resistance heating element is connected in series with the second resistance heating element;
   the fourth layer of dielectric material comprises a third via; and
   the third via connects the fourth resistance heating element to a second line.

30. The multi-plane heater of claim 21, wherein the body of dielectric material comprises:
   a first plurality of resistance heating elements including the first resistance heating element, wherein the first resistance heating element is disposed in the first layer of dielectric material;
   a second plurality of resistance heating elements including the second resistance heating element, wherein the second resistance heating element is disposed in the second layer of dielectric material;
   a first via connecting the first resistance heating element to the second resistance heating element;
   a second via connecting a third resistance heating element to a fourth resistance heating element;

the first layer of dielectric material includes the third resistance heating element; and the second layer of dielectric material includes the fourth resistance heating element.

31. The multi-plane heater of claim 30, wherein the body of dielectric material comprises:
a third layer of dielectric material comprising a first line;
a fourth layer of dielectric material comprising a second line;
the third layer of dielectric material comprises a third via connecting the second resistance heating element to the second line; and
the fourth layer of dielectric material comprises a fourth via connecting the fourth resistance heating element to the first line.

32. The multi-plane heater of claim 30, wherein:
the first plurality of resistance heating elements includes the third resistance heating element;
the second plurality of resistance heating elements includes the fourth resistance heating element;
the first plurality of resistance heating elements are connected in series;
the second plurality of resistance heating elements are connected in series; and
the first plurality of resistance heating elements are connected in parallel with the second plurality of resistance heating elements.

33. The multi-plane heater of claim 1, wherein the first resistance heat element and the second resistance heat element of the individually addressable thermal control element do not supply current to or receive current from another resistance heat element of the multi-plane heater.

34. The multi-plane heater of claim 1, wherein the first resistance heat element and the second resistance heat element are not electrically connected to another resistance heat element of the multi-plane heater.

35. The multi-plane heater of claim 1, wherein the individually addressable thermal control element does not include a resistance heating element other than the first resistance heating element and the second resistance heating element.

36. A system comprising:
the multi-plane heater of claim 1;
a distribution circuit connected to the multi-plane heater and configured to distribute power to the individually addressable thermal control element; and
a switching circuit configured to control the distribution circuit to supply power to the individually addressable thermal control element without supplying power to another resistance heating element of the multi-plane heater.

37. The system of claim 36, wherein the first resistive heating element and the second resistive heating element receive a same amount of current from the distribution circuit.

38. The multi-plane heater of claim 1, wherein the first resistance element and the second resistance element are capable of being powered as the unitary structure without powering any other resistance heat element of the multi-plane heater.

39. A system comprising:
the multi-plane heater of claim 1; and
a power switching circuit comprising a processor and a plurality of switches, wherein the processor and the plurality of switches are configured to address the individually addressable thermal control element, including supplying power to the first resistance heating element and the second resistance heating element, while not supplying power to any other heating elements of the multi-plane heater.

40. A multi-plane heater of a semiconductor substrate support for supporting a semiconductor substrate in a plasma processing chamber, the multi-plane heater comprising:
a first resistance heating element;
a second resistance heating element; and
a body of dielectric material containing the first resistance heating element and the second resistance heating element,
wherein
the first resistance heating element is vertically offset from and electrically connected in series with the second resistance heating element such that the first resistance heating element and the second resistance heating element form an individually addressable thermal control element and such that the first resistance heat element and the second resistance heat element are capable of being powered as a single connected structure,
when addressed both the first resistance heat element and the second resistance heat element are powered, and
the single connected structure is capable of being addressed without addressing another resistance heat element of the multi-plane heater.

41. The multi-plane heater of claim 40, wherein the first resistance element and the second resistance element are capable of being addressed as the single connected structure without addressing any other resistance heat element of the multi-plane heater.

* * * * *